(12) United States Patent
Yen et al.

(10) Patent No.: US 7,457,154 B2
(45) Date of Patent: *Nov. 25, 2008

(54) HIGH DENSITY MEMORY ARRAY SYSTEM

(75) Inventors: Tzu-shih Yen, Taipei (TW); Erik S. Jeng, Taipei (TW)

(73) Assignee: Applied Intellectual Properties Co., Ltd., Taipei (TW)

( * ) Notice: Subject to any disclaimer, the term of this patent is extended or adjusted under 35 U.S.C. 154(b) by 167 days.

This patent is subject to a terminal disclaimer.

(21) Appl. No.: 11/445,205

(22) Filed: Jun. 2, 2006

(65) Prior Publication Data

US 2006/0239070 A1    Oct. 26, 2006

Related U.S. Application Data

(63) Continuation-in-part of application No. 10/831,199, filed on Apr. 26, 2004, now Pat. No. 7,072,210.

(51) Int. Cl.
*G11C 11/34* (2006.01)

(52) U.S. Cl. .......................... 365/185.01; 365/185.05; 365/185.26

(58) Field of Classification Search ............ 365/185.01, 365/185.05, 185.26, 185.22, 185.23, 185.29
See application file for complete search history.

(56) References Cited

U.S. PATENT DOCUMENTS

| | | | |
|---|---|---|---|
| 5,592,415 A * | 1/1997 | Kato et al. ............. | 365/185.01 |
| 6,524,913 B1 | 2/2003 | Lin et al. | |
| 6,545,915 B2 | 4/2003 | Ohtani et al. | |
| 6,577,531 B2 | 6/2003 | Kato | |
| 6,788,601 B2 | 9/2004 | Takano et al. | |
| 6,855,608 B1 | 2/2005 | Ramsbey et al. | |
| 6,903,968 B2 | 6/2005 | Jeng | |
| 7,072,210 B2 * | 7/2006 | Jeng ....................... | 365/185.01 |
| 2003/0230783 A1 * | 12/2003 | Willer et al. ................. | 257/390 |
| 2004/0023440 A1 | 2/2004 | Ito et al. | |
| 2004/0119112 A1 | 6/2004 | Lojek | |
| 2007/0058435 A1 * | 3/2007 | Chen et al. ............. | 365/185.22 |

FOREIGN PATENT DOCUMENTS

JP    6-302830 A    10/1994

* cited by examiner

*Primary Examiner*—Dang T Nguyen
(74) *Attorney, Agent, or Firm*—Birch, Stewart, Kolasch & Birch, LLP

(57) ABSTRACT

A memory system comprising a memory array having a plurality of memory units, a column decoder, a row decoder, a selecting/driving circuit and a sensing circuit is disclosed. Each memory unit comprises a gate electrode coupled to a word lines, a source region coupled to a source line or a first bit line, a drain region coupled to a drain line or a second bit line, a first spacer between the source region and the gate electrode and a second spacer between the drain region and the gate electrode. When a first-bit program operation is performed on the memory unit, a switch-on signal is applied to the gate, a programming signal is applied to the source region and the drain region is switched to ground. As the memory unit is activated, the carriers are injected and stored in a first spacer, thus represents a first bit in the memory unit.

33 Claims, 19 Drawing Sheets

HIGH DENSITY MEMORY ARRAY SYSTEM

CROSS REFERENCE TO RELATED APPILCATIONS

This application is a Continuation-In-Part of application Ser. No. 10/831,199, filed Apr. 26, 2004, now U.S. Pat. No. 7,072,210 and entitled "Memory Array".

BACKGROUND OF THE INVENTION

1. Field of the Invention

The invention relates to a semiconductor device, and more particularly to a memory array with increased data throughput.

2. Description of the Related Art

Non-volatile read only memory (ROM) retains information even if power is cut off. Erasable ROM types comprise Mask ROM, EPROM, EEPROM, and Flash Memory, of which Mask ROM cannot modify stored data, and is suited to large fabrications. Additionally, Flash Memory, using electrons entering and exiting floating gate to store information, is non-volatile and accessible, and can also restore and access information even when power is not provided.

FIG. 1a is a cross section of a conventional flash memory unit during programming. When programming is performed, a high voltage is applied to a control gate electrode 105 and a drain region 101a, and then electrons penetrate through a gate oxide layer 102 to a floating gate electrode 103 from the drain region 101a in a silicon substrate 101.

FIG. 1b is a cross section of a conventional flash memory unit during erasure. When erasure is performed, a negative or zero voltage is applied to the control gate electrode 105, and a high voltage is applied to the drain region 101a in the silicon substrate 101. Electrons then penetrate through the gate oxide layer 102 back to the drain region 101a from the floating gate electrode 103.

As a result, one set of data can be programmed or erased each time by the conventional flash memory unit, that is, the maximum set count of data programmed or erased each time equals the number of memory units.

FIG. 1c is a cross section of a conventional programmed Mask ROM. The programming process is disclosed as follows. First, a silicon substrate 120 having a memory unit, such as a MOS transistor, thereon is provided. An oxide layer 122 is then formed over the silicon substrate 120. The memory unit comprises a gate electrode 123, such as a polysilicon layer, and source/drain regions 121a and 121b, such as n+ or p+ diffusion region, here, the source/drain regions 121a and 121b are n+ diffusion regions.

Next, a lithography process is performed using a code mask to form a patterned photoresist layer over a part of the gate electrode 123 and the source/drain regions 121a and 121b. Channel implantation with the silicon substrate 120 having memory units is then performed to complete the memory unit coding. When the gate electrode 123 is uncovered by the patterned photoresist, the memory unit is defined as logic "1" due to implantation of the channel region 124, to the contrary, when the gate electrode 123 is covered by the patterned photoresist, the memory unit is defined as logic "0", because the channel region 124 cannot be implanted.

Implantation Programming is completed by implanting ions into channel region to adjust the threshold voltage. This process is performed after forming the MOS transistor, and before forming contacts or inter layer dielectrics (ILD).

As integration density is increased, reduced time and memory unit size, and increased quantity and speed of data treatment are required for fabricating Mask ROMs.

SUMMARY OF THE INVENTION

Accordingly, an object of the present invention is to provide various multi-bit memory arrays to increase memory unit density, and thereby, throughput.

To achieve this and other objects, the present invention provides a memory array, comprising a plurality of word lines, a plurality of first source/drain lines, a plurality of second source/drain lines, and a plurality of memory units. Each memory unit comprises a gate electrode coupled to one of the word lines, a first source/drain region coupled to one of the first source/drain lines or first bit lines, a second source/drain region coupled to one of the second source/drain lines or second bit lines, a first spacer between the first source/drain region and the gate electrode to store electrons or electric charges, a second spacer between the second source/drain region and the gate electrode to store electrons or electric charges.

In one embodiment of the invention, the memory array further comprises a selecting/driving circuit coupled to a plurality of word lines and a plurality of first and second bit lines of the memory units, a sensing circuit coupled to the first and the second bit lines, and a controller for executing memory operations on the memory units. The controller electrically connected to the selecting/driving and sensing circuits, receives a command from an external data bus or command bus and an address from the external address bus. Thus, the controller generates and transmits a plurality of control signals to the selecting/driving and sensing circuits based on the received command and outputs the status and data stored in the memory array based on the address. The controller is capable of performing at least one of various operating functions including an initializing operation, a reading operation, a programming operation, a program-verifying operation, an erasing operation, an erase-verifying operation, a self-testing operation and a repairing operation.

The present invention also provides another memory array, comprising a plurality of word lines, a plurality of first source/drain lines, a plurality of second source/drain lines, and a plurality of memory units. Each memory unit comprises a gate electrode coupled to one of the word lines, a first source/drain region coupled to one of the first source/drain lines or first bit lines, a second source/drain region coupled to one of the second source/drain lines or second bit lines, a programmable source/drain extended area between the gate electrode and the first or second source/drain region to store or keep electric information.

The memory array further comprises a selecting/driving circuit coupled to the word lines, the first bit lines and the second bit lines, a sensing circuit coupled to the first and the second bit lines, and a controller for executing a memory operation on the memory units. The controller coupled to the selecting/driving and sensing circuits receive a command from an external data bus or command bus and an address from the external address bus. Thus, the controller generates and transmits a plurality of control signals to the selecting/driving and sensing circuits based on the received command and outputs the status and data stored in the memory array based on the address. The controller is capable of performing at least one of various operating functions including an initializing operation, a reading operation, a self-testing operation and a repairing operation.

A detailed description is given in the following embodiments with reference to the accompanying drawings.

BRIEF DESCRIPTION OF THE DRAWINGS

For a better understanding of the invention, reference is made to a detailed description to be read in conjunction with the accompanying drawings, in which.

DETAILED DESCRIPTION OF THE INVENTION

Figure 1A:
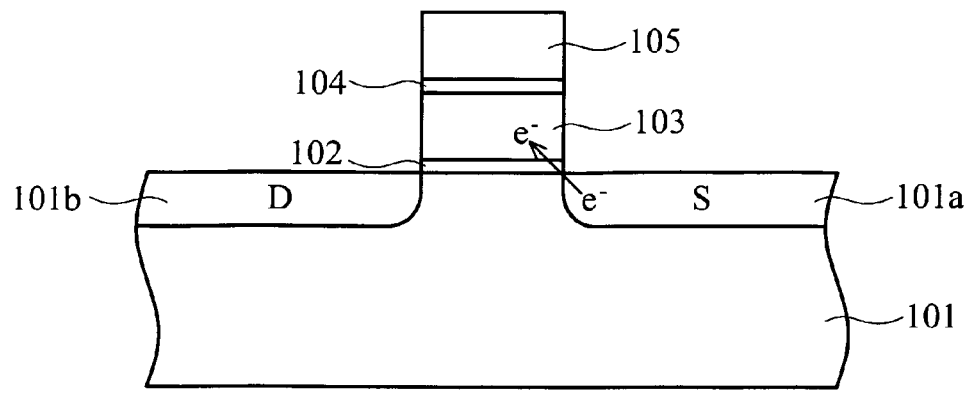
FIG. 1a shows a cross section of a conventional flash memory unit during programming.
Figure 1B:
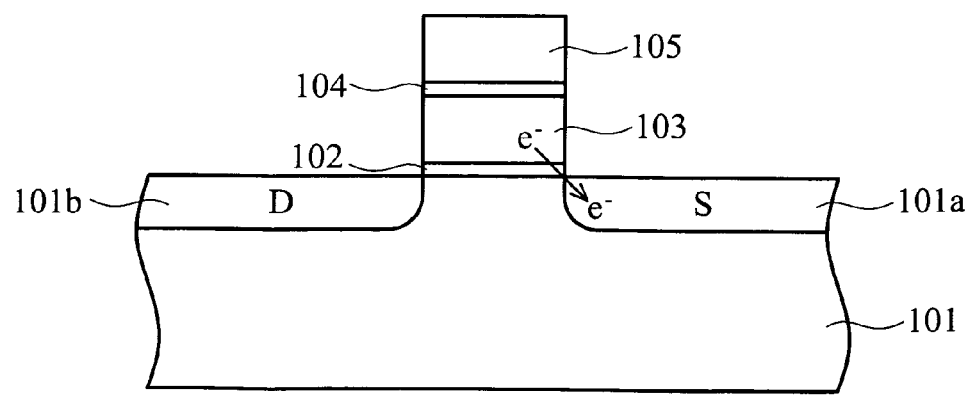
FIG. 1b shows a cross section of a conventional flash memory unit during erasure.
Figure 1C:
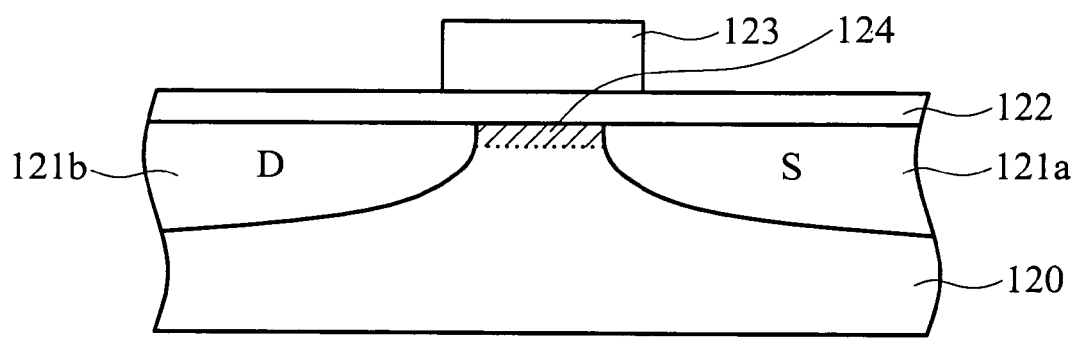
FIG. 1c shows a cross section of a conventional programmed Mask ROM.
Figure 2A:
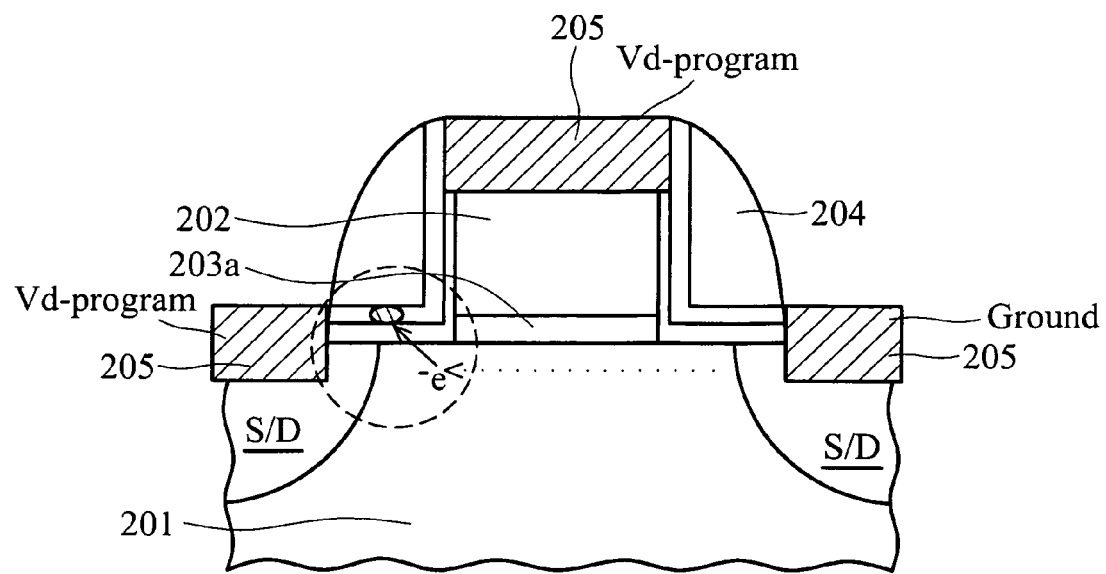
FIG. 2a shows a cross section of one embodiment of the multi-bit EPROM unit of the invention during a left-bit programming operation.

FIG. 2a shows a cross section of one embodiment of the multi-bit EPROM unit of the invention during a left-bit programming operation. The multi-bit memory unit comprises a semiconductor substrate 201 having a source region and a drain region therein, a gate electrode 202, such as a polysilicon layer, on the semiconductor substrate 201, a gate dielectric layer 203a, such as a gate oxide layer, between the gate electrode 202 and the semiconductor substrate 201, a spacer 204, such as a nitride layer, on a sidewall of the gate electrode 202 to store electrons or electric charges, an oxide layer 203b between the spacer 204 and the gate electrode 202, and a metal-semiconductor compound layer 205, such as TiSi$_2$, CoSi$_2$ or NiSi, over the gate electrode 202 and the source/drain region. The memory unit also comprises a dielectric layer, such as an oxide layer, over the semiconductor substrate 201 and the above elements, and a contact plug filled with a conductive layer in the dielectric layer to connect the source/drain region installed between gate electrodes and a subsequently formed bit line.

When a left-bit programming operation is performed on the EPROM unit, a programming gate signal, Vg-program, is applied to the gate electrode 202 via the metal-semiconductor compound layer 205, a programming drain signal, Vd-program, is applied to the source region and the drain region is coupled to ground. In this embodiment, the EPROM unit is selected by a word line, such as WL1 in FIG. 3a, via a column decoder and a bit line, such as BL3 in FIG. 3a, via a row decoder. As the memory unit is activated, the carriers, e$^-$, are injected and stored in a multi-layer dielectric spacer (not labeled) at the left side of the gate as shown in FIG. 2a. The presence of charge in the dielectric spacer represents a digital state of the memory unit.

Figure 2B:
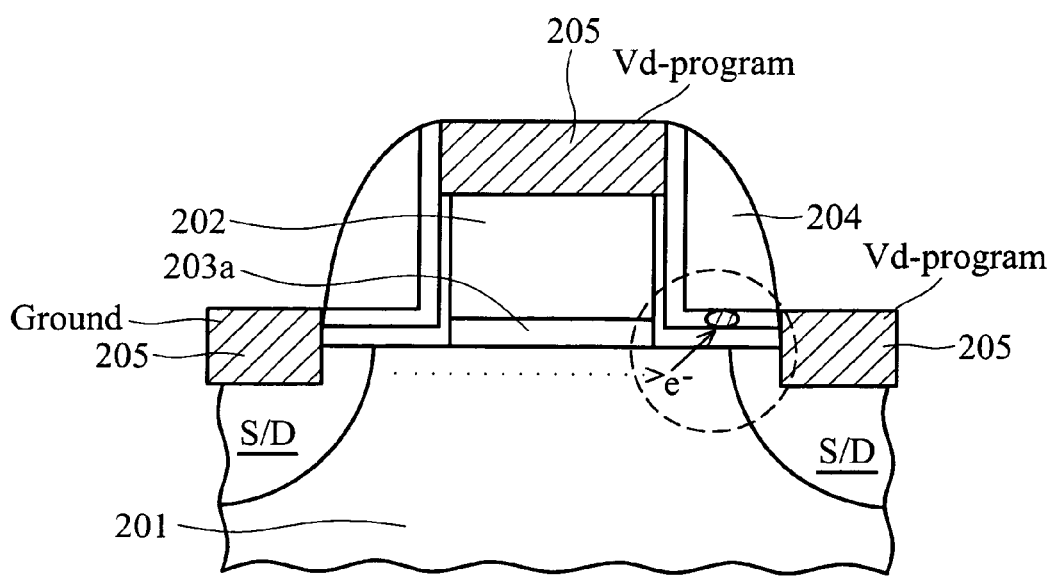
FIG. 2b shows a cross section of one embodiment of the multi-bit EPROM unit of the invention during a right-bit programming operation.
Figure 2C:
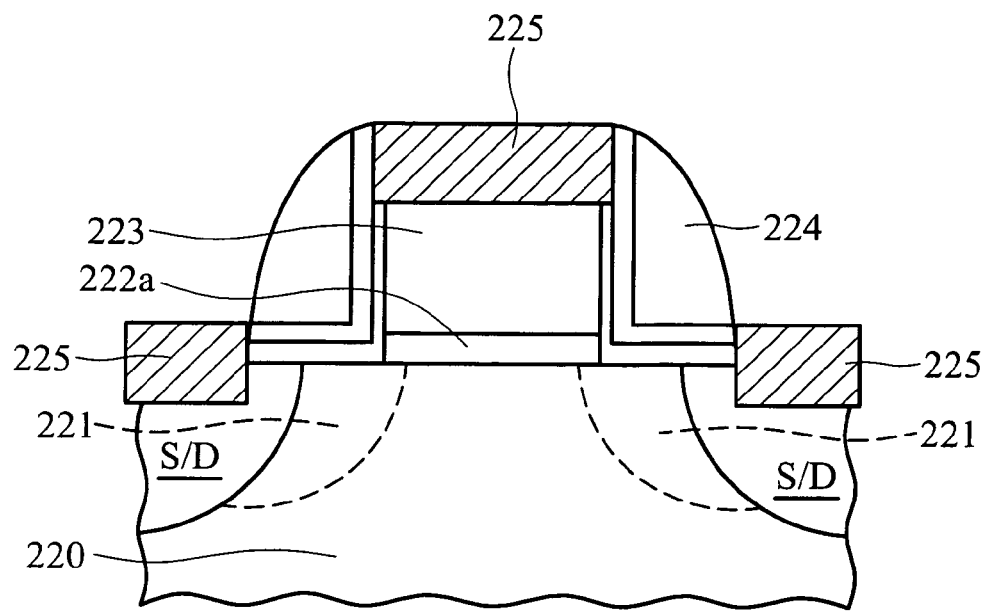
FIGS. 2c, 2d, 2e and 2f show cross sections of a multi-bit Mask ROM of the invention respectively having digital states of (11), (10), (01) and (00).
Figure 2D:
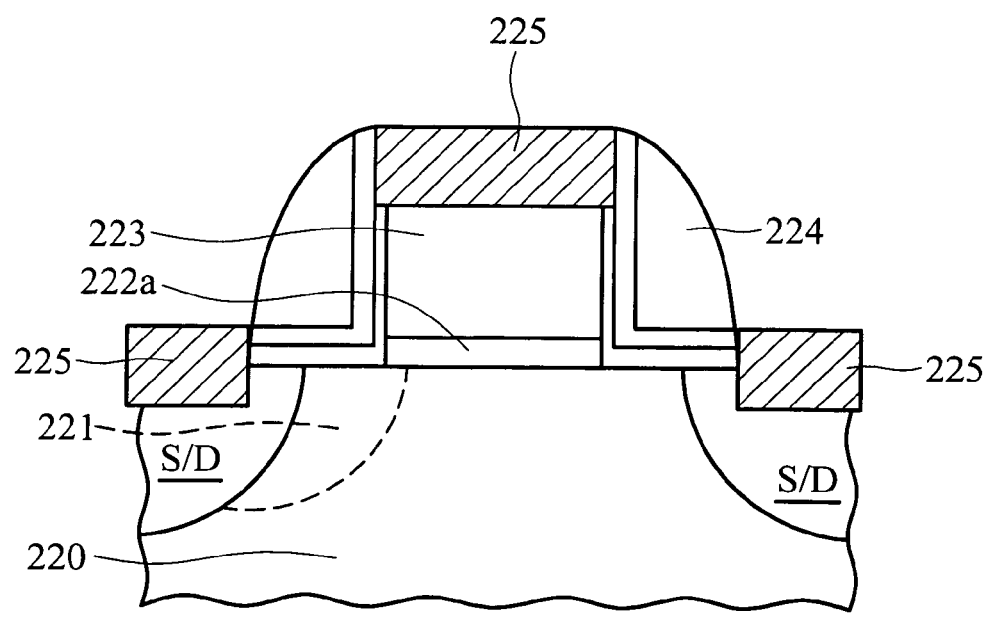
Figure 2E:
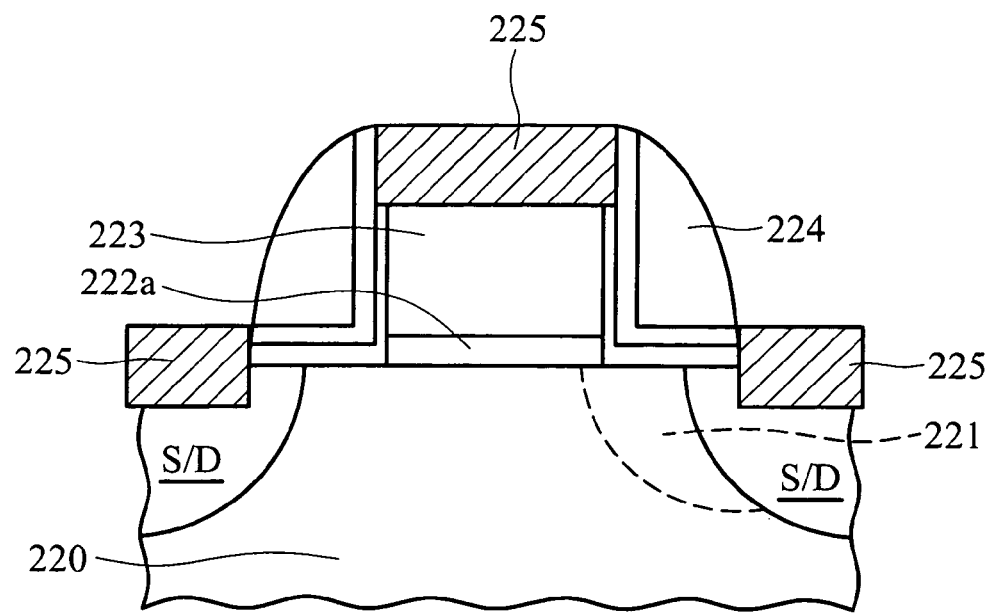
Figure 2F:
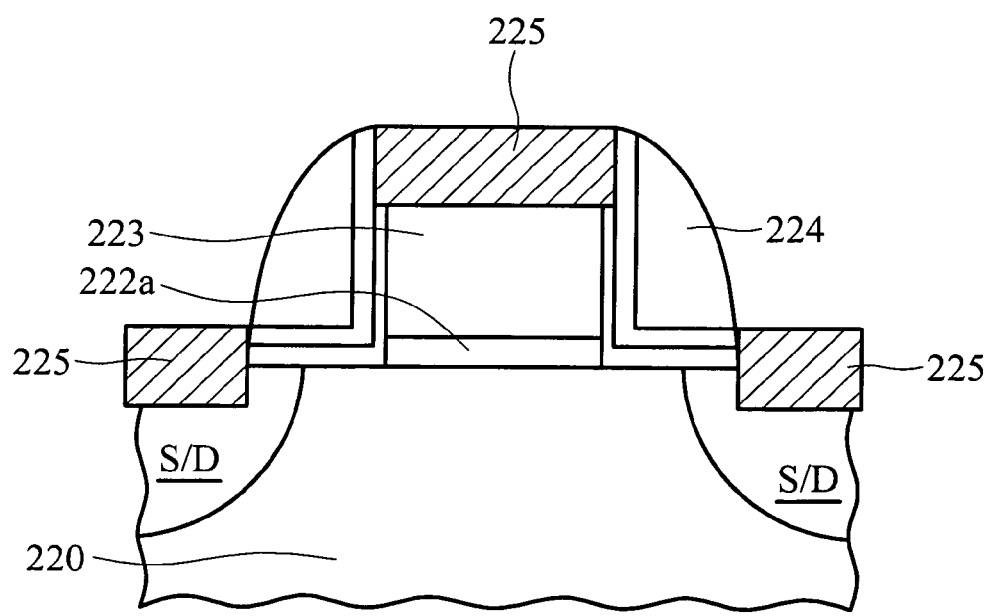

FIG. 2b shows a cross section of one embodiment of the multi-bit EPROM unit of the invention during a right-bit program operation. When a right-bit programming operation is performed on the EPROM unit, a programming gate signal, Vg-program, is applied to the gate electrode 202 via the metal-semiconductor compound layer 205, a programming drain signal, Vd-program, is applied to the drain region and the source region is coupled to ground. In this embodiment, the EPROM unit is selected by a word line, such as WL1 in FIG. 3a, via a column decoder and a bit line, such as BL3 in FIG. 3a, via a row decoder. As the memory unit is activated, the carriers, e$^-$, are injected and stored in a multi-layer dielectric spacer (not labeled) at the right side of the gate as shown in FIG. 2b. The presence of charges in the dielectric spacer represents a digital state of the memory unit. Thus, the EPROM unit of FIG. 2a and FIG. 2b can store 2 bits of data therein based on the left-bit and right-bit programming operation.

FIGS. 2c, 2d, 2e and 2f show cross sections of a multi-bit Mask ROM of the invention respectively having digital states of (11), (10), (01) and (00). The multi-bit memory unit comprises a semiconductor substrate 220 having a gate dielectric layer 222a and a gate electrode 223 thereon and a source/drain extension area 221 therein under one side of the gate electrode 223, a spacer 224 on a sidewall of the gate electrode 223, an oxide layer 222b between the spacer 224 and the gate electrode 223, a source/drain region in the semiconductor substrate 220, and a metal-semiconductor compound layer 225 over the gate electrode 223 and the source/drain region, wherein the source/drain extension area 221 is formed using a photoresist layer and the gate electrode 223 as masks formed by a code mask, and the source/drain region is formed by implanting the semiconductor substrate 220 with As or P ions using the gate electrode 223 and the spacer 224 as masks.

If the source/drain extension area 221 is not formed between the source/drain region and the gate electrode 223, the threshold voltage of the memory unit may increase. When accessing data, if a normal voltage is applied to the gate electrode 223, the source/drain region can not be conducted, producing merely lowered leakage current, thus the logic "0" is accessed. If the source/drain extension area 221 is formed between the source/drain region and the gate electrode 223, the threshold voltage of the memory unit may decrease. When accessing data, if a normal voltage is applied to the gate electrode 223, the source/drain region can be conducted, and logic "1" is accessed. Thus, the memory unit is accessed as logic "1", when the source/drain extension 221 is formed coupled to the gate electrode 223, and the memory unit is accessed as logic "0", when the source/drain extension 221 is not coupled to the gate electrode 223.

FIRST EMBODIMENT

Figure 3A:
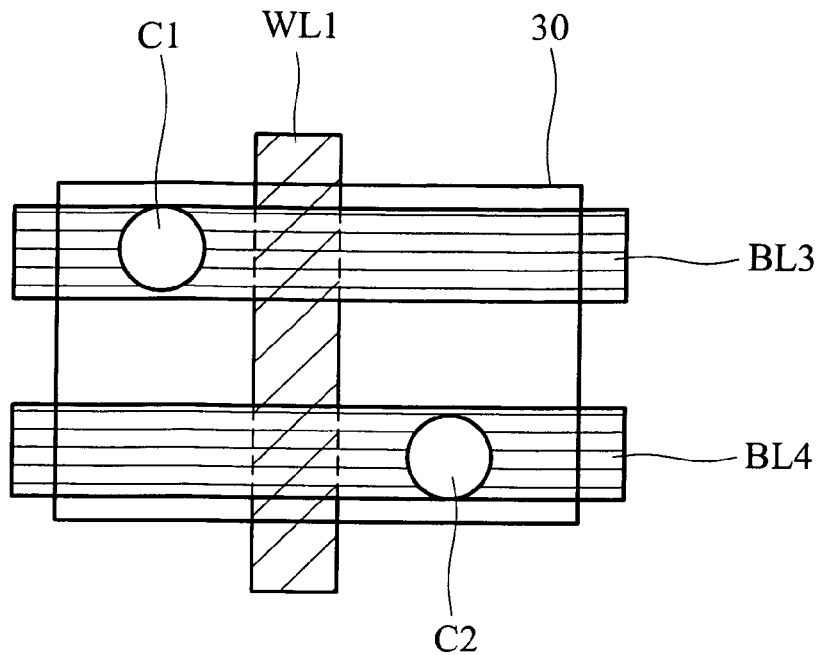
FIG. 3a shows a single multi-bit memory unit of the first embodiment of the invention.
Figure 3B:
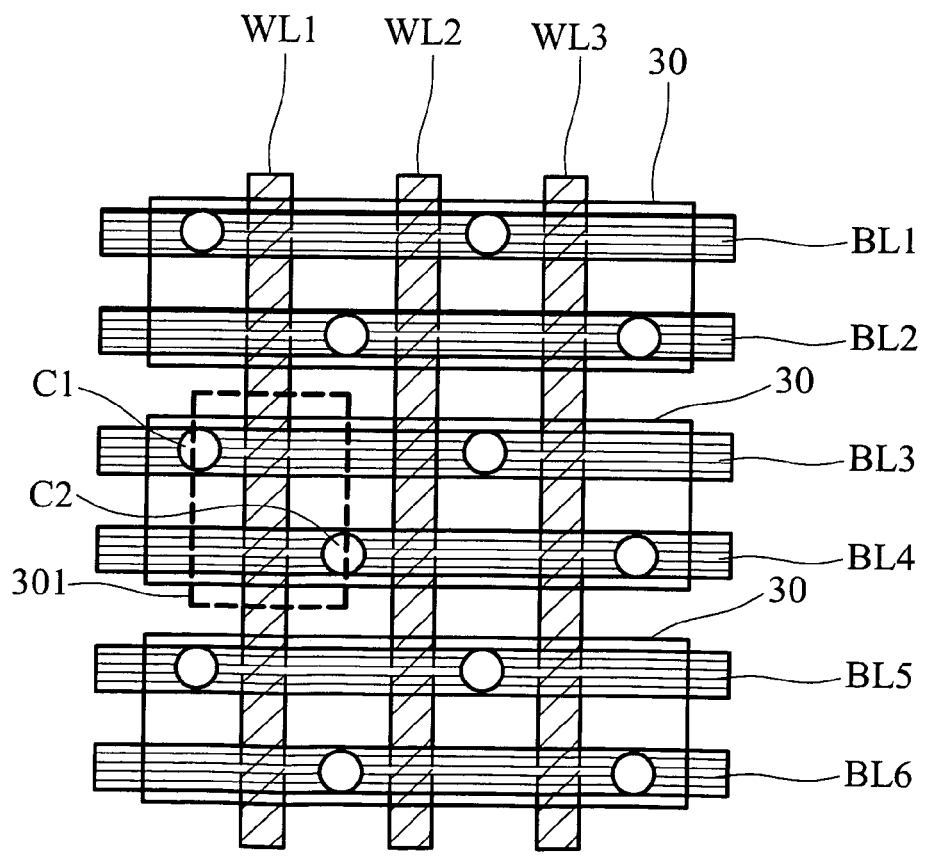
FIG. 3b shows a multi-bit memory array of the first embodiment of the invention.
Figure 3C:
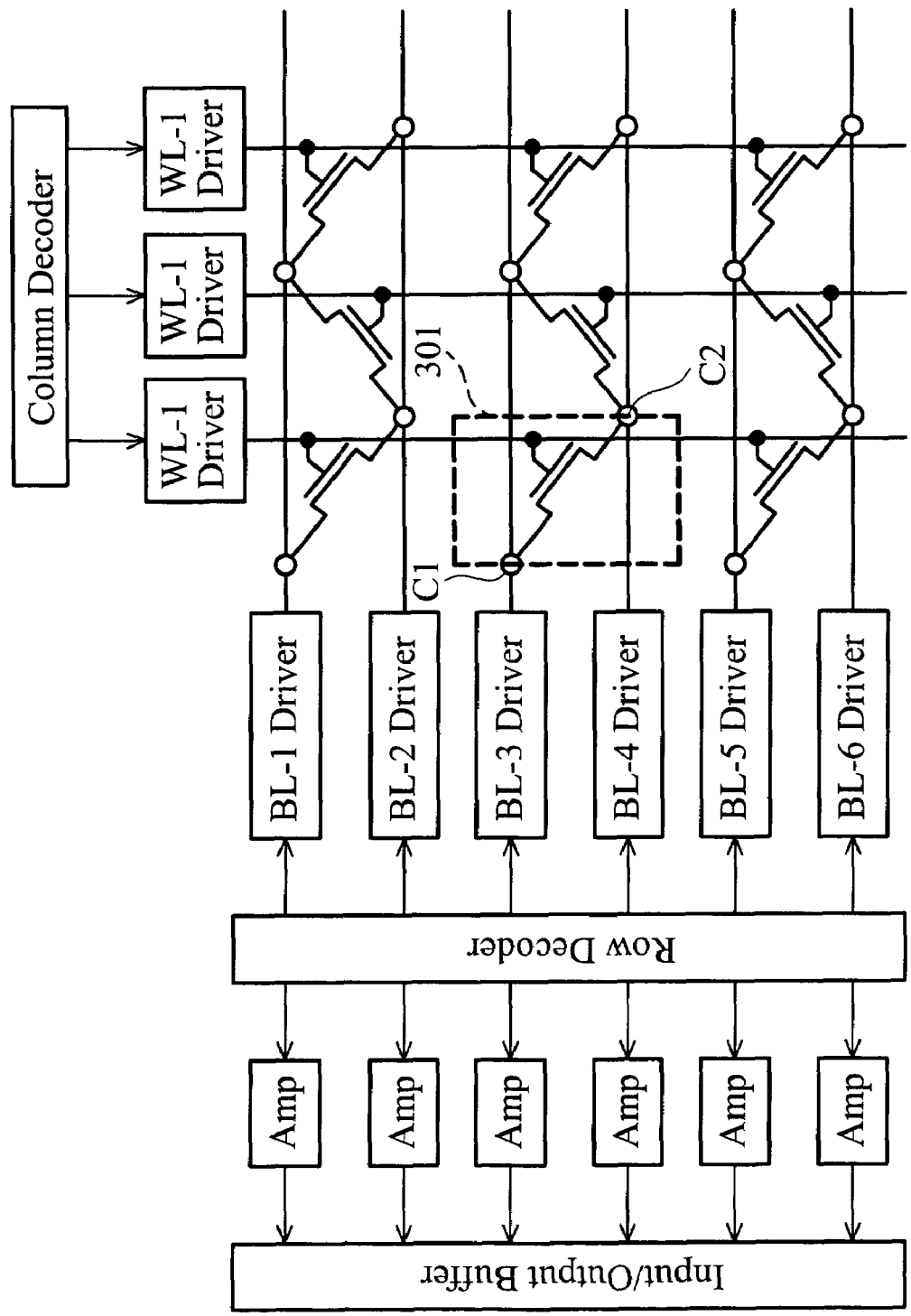
FIG. 3c shows a multi-bit memory array of FIG. 3b with peripheral circuits.

FIG. 3a shows a single multi-bit memory unit in the first embodiment of the resent invention, FIG. 3b shows a memory array in the first embodiment of the present invention, and FIG. 3c shows a multi-bit memory array of FIG. 3b with peripheral circuits.

Referring to FIG. 3a, a semiconductor substrate (not shown) having the multi-bit memory unit shown in FIG. 2a or 2b is provided, with an active area 30 defined therein.

The multi-bit memory unit comprises a word line $WL^1$, a first bit line $BL^3$, a second bit line $BL^4$, a first connection point $C^1$, and a second connection point $C^2$, wherein the word line is the gate electrode, and the connection points are contact plugs.

The word line $WL^1$ is perpendicular to the first bit line $BL^3$ and the second bit line $BL^4$. The first bit line $BL^3$ is parallel to the second bit line $BL^4$, and the first bit line $BL^3$ and the second bit line $BL^4$ are separated into two portions by the word line $WL^1$. The first connection point $C^1$ electrically connects to the first bit line $BL^3$, and the second connection point $C^2$ electrically connects to the second bit line $BL^4$, wherein the first connection point $C^1$ and the second connection point $C^2$ are located on the first and second source/drain regions separated by the word line $WL^1$. The active area 30 is under the above elements. The active area 30 is rectangular, and the first connection point $C^1$ and the second connection point $C^2$ are respectively located on the diagonal position thereof.

Referring to FIG. 3b, the memory array comprises word lines $WL^1$, $WL^2$, and $WL^3$, bit lines $BL^1$, $BL^2$, $BL^3$, $BL^4$, $BL^5$, and $BL^6$, connection points $C^1$ and $C^2$, memory unit 301, and active areas 30, wherein the memory unit 301 is the single multi-bit memory unit shown in FIG. 3a. Each connection point can be jointly used by adjacent memory units, for example, the second connection point $C^2$ is jointly used by the memory unit 301 and its adjacent memory unit to form the electrical connection, as shown in FIG. 3c.

FIG. 3c shows a multi-bit memory array of FIG. 3b with peripheral circuits.

The memory array is driven by word line drivers, such as WL-1 Driver, and bit line drivers, such as BL-1 Driver. The word line driver is coupled to one word line and when the word line driver receive a control signal from the column decoder, the word line driver enables a selected column of memory units. The bit line driver is coupled to one bit line, wherein the bit line may be a first bit line or a second bit line. When data is written to or read from the memory array, an address is transmitted to the column decoder and the row decoder to enable the corresponding word line driver and bit line driver to activate the selected memory unit. The amplifier Amp further senses the output signal of the data in a memory unit to a predetermined electrical level and the data of the memory unit is temporarily stored in the output buffer.

SECOND EMBODIMENT

Figure 4A:
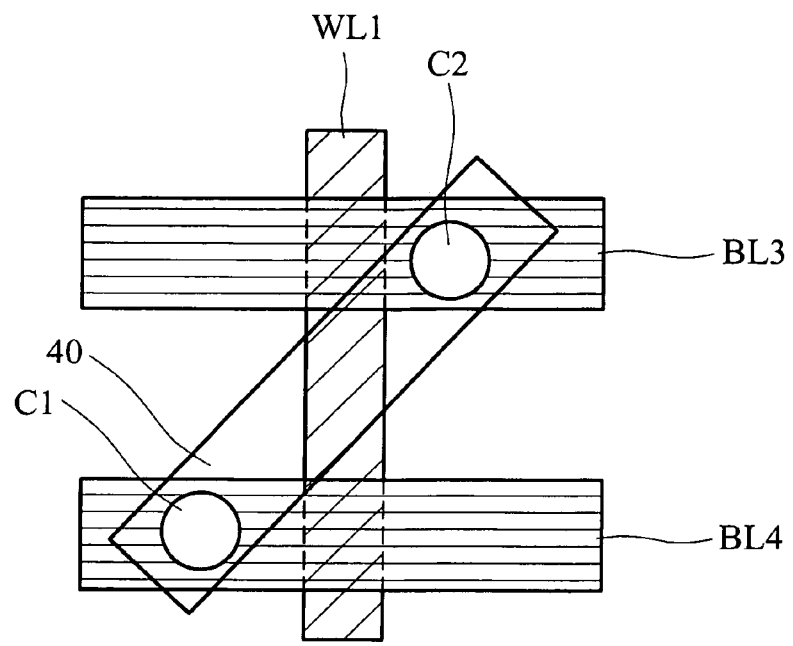
FIG. 4a shows a single multi-bit memory unit of the second embodiment of the invention.
Figure 4B:
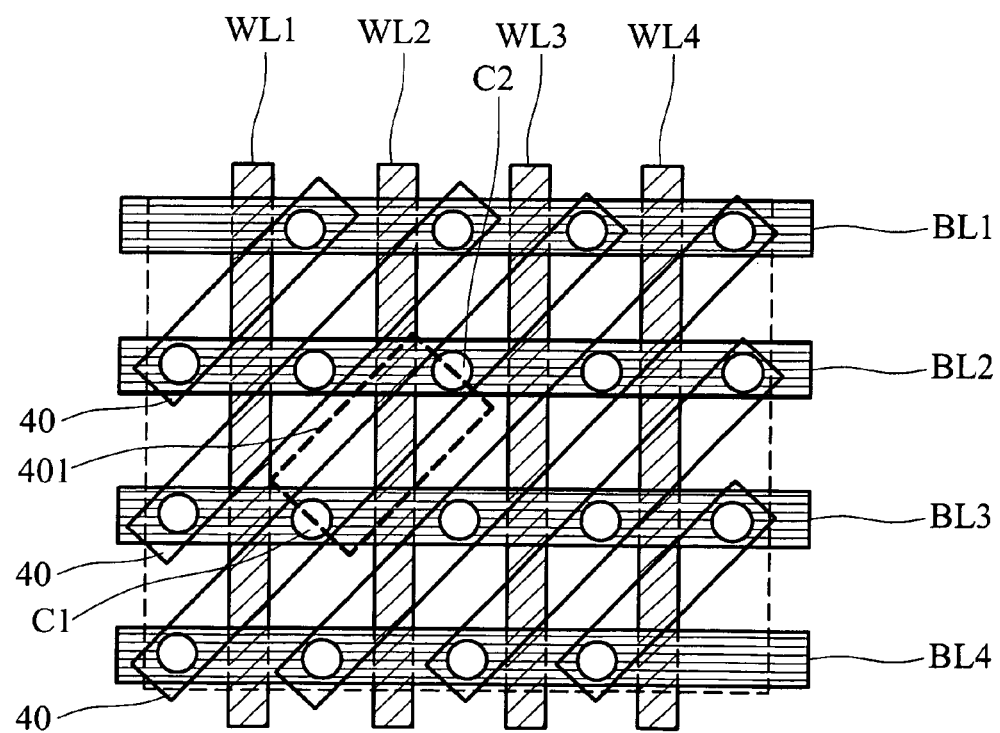
FIG. 4b shows a multi-bit memory array of the second embodiment of the invention.
Figure 4C:
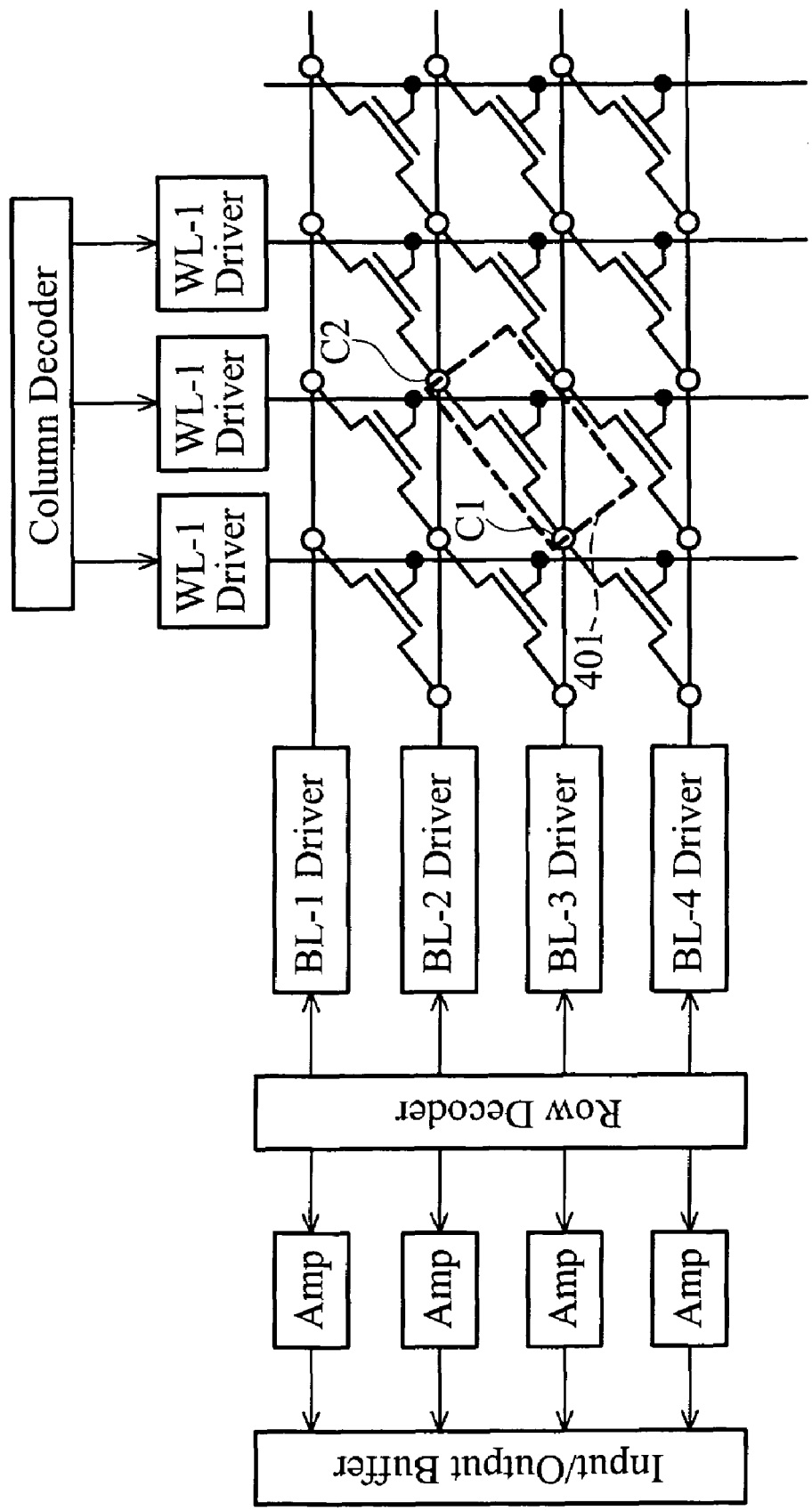
FIG. 4c shows a multi-bit memory array of FIG. 4b with peripheral circuits.

FIG. 4a shows a single multi-bit memory unit of the second embodiment of the invention, FIG. 4b shows a memory array of the second embodiment of the invention, and FIG. 4c shows a multi-bit memory array of FIG. 4b with peripheral circuits.

Referring to FIG. 4a, a semiconductor substrate (not shown) having the multi-bit memory unit shown in FIG. 2a or 2b is provided, with an active area 40 defined therein.

The multi-bit memory unit comprises a word line $WL^1$, a first bit line $BL^3$, a second bit line $BL^4$, a first connection point $C^1$, and a second connection point $C^2$, wherein the word line is the gate electrode, and the connection points are contact plugs.

The word line $WL^1$ is perpendicular to the first bit line $BL^3$ and the second bit line $BL^4$. The first bit line $BL^3$ is parallel to the second bit line $BL^4$, and the first bit line $BL^3$ and the second bit line $BL^4$ are separated into two portions by the word line $WL^1$. The first connection point $C^1$ electrically connects to the first bit line $BL^3$, and the second connection point $C^2$ electrically connects to the second bit line $BL^4$, wherein the first connection point $C^1$ and the second connection point $C^2$ are located on the first and second source/drain regions separated by the word line $WL^1$. The active area 40 is under the above elements. The active area 40 is rectangular, and the first connection point $C^1$ and the second connection point $C^2$ are respectively located on two ends of the active area 40. The included angle between the active area 40 and the word line $WL^1$ is less than 90°.

Referring to FIG. 4b, the memory array comprises word lines $WL^1$, $WL^2$, $WL^3$, and $WL^4$, bit lines $BL^1$, $BL^2$, $BL^3$, and $BL^4$, connection points $C^1$ and $C^2$, memory unit 401, and active areas 40, wherein the memory unit 401 is the single multi-bit memory unit shown in FIG. 4a. Each connection point can be jointly used by adjacent memory units, for example, the second connection point $C^2$ is jointly used by the memory unit 401 and its adjacent memory unit to form the electrical connection, as shown in FIG. 4c.

FIG. 4c shows a multi-bit memory array of FIG. 4b with peripheral circuits.

The memory array is driven by word line drivers, such as WL-1 Driver, and bit line drivers, such as BL-1 Driver. The word line driver is coupled to one word line and when the word line driver receive a control signal from the column decoder, the word line driver enables a selected column of memory units. The bit line driver is coupled to one bit line, wherein the bit line may be a first bit line or a second bit line. When data is written to or read from the memory array, an address is transmitted to the column decoder and the row decoder to enable the corresponding word line driver and bit line driver to activate the selected memory unit. The amplifier Amp further senses the output signal of the data in a memory unit to a predetermined electrical level and the data of the memory unit is temporarily stored in the output buffer.

THIRD EMBODIMENT

Figure 5A:
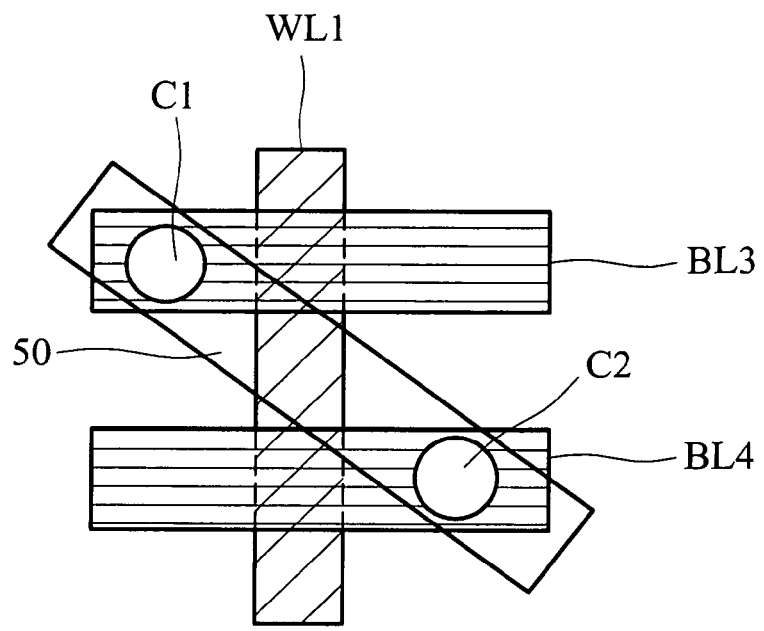
FIGS. 5a and 5b show two single multi-bit memory units in the third embodiment of the invention.
Figure 5B:
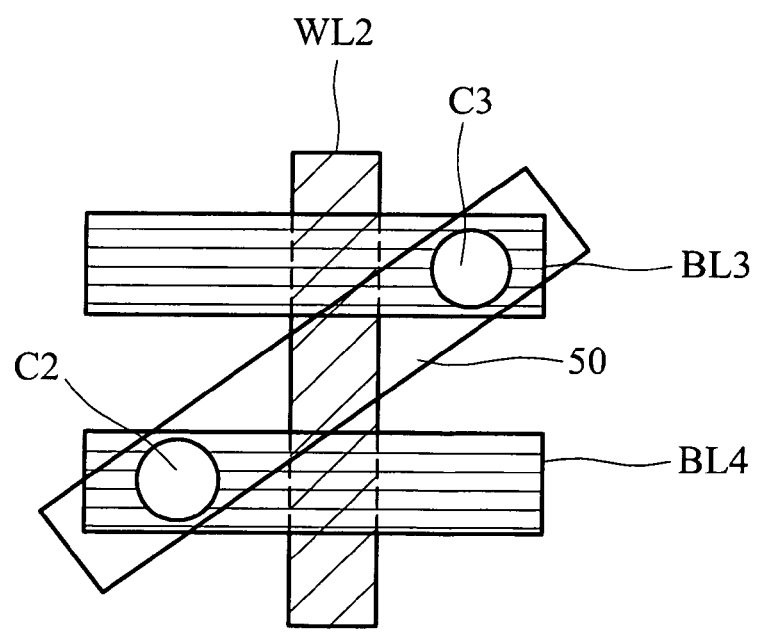
Figure 5C:
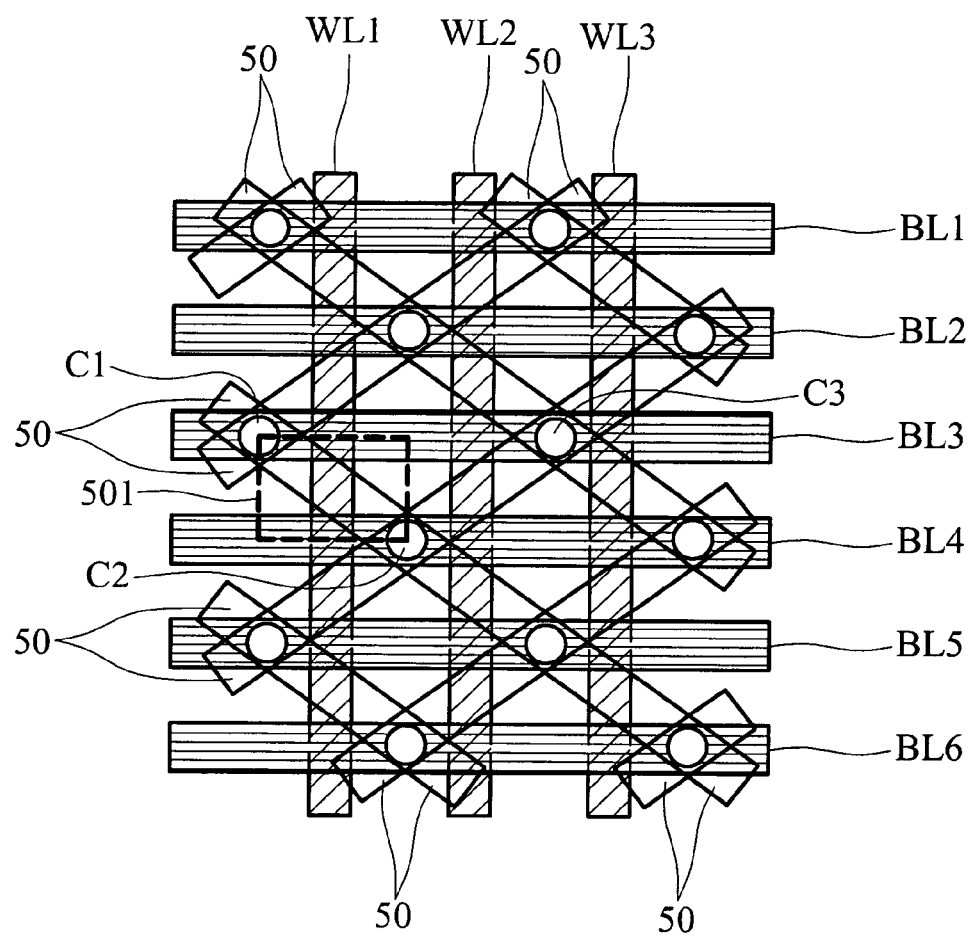
FIG. 5c shows a multi-bit memory array of the third embodiment of the invention.
Figure 5D:
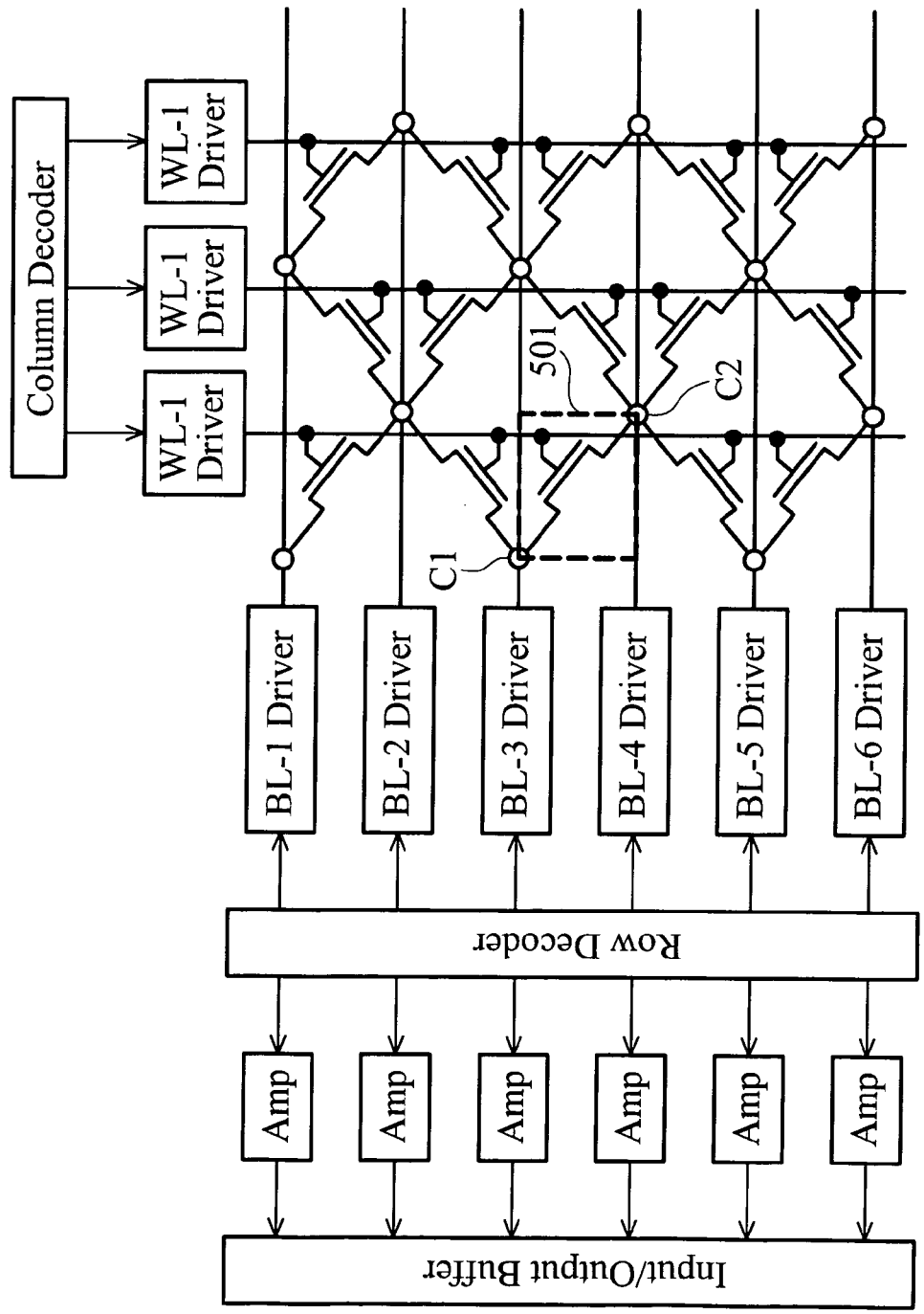
FIG. 5d shows a multi-bit memory array of FIG. 5c with peripheral circuits.

FIGS. 5a and 5b show two single multi-bit memory units of the third embodiment of the invention, FIG. 5c shows a memory array of the third embodiment of the invention, and FIG. 5d shows a multi-bit memory array of FIG. 5c with peripheral circuits.

Referring to FIGS. 5a and 5b, a semiconductor substrate (not shown) having a multi-bit memory unit shown in FIG. 2a or 2b is provided, with an active area 50 defined therein.

Referring to FIG. 5a, one of the two multi-bit memory units is disclosed as follows. The multi-bit memory unit comprises a word line $WL^1$, a first bit line $BL^3$, a second bit line $BL^4$, a first connection point $C^1$, and a second connection point $C^2$, wherein the word line is the gate electrode, and the connection points are contact plugs.

The word line $WL^1$ is perpendicular to the first bit line $BL^3$ and the second bit line $BL^4$. The first bit line $BL^3$ is parallel to the second bit line $BL^4$, and the first bit line $BL^3$ and the second bit line $BL^4$ are separated into two portions by the word line $WL^1$. The first connection point $C^1$ electrically connects to the first bit line $BL^3$, and the second connection point $C^2$ electrically connects to the second bit line $BL^4$, wherein the first connection point $C^1$ and the second connection point $C^2$ are located on the first and second source/drain regions separated by the word line $WL^1$. The active area 50 is under the above elements. The active area 50 is rectangular, and the first connection point $C^1$ and the second connection point $C^2$ are respectively located at two ends of the active area 50. The included angle between the active area 50 and the word line $WL^1$ is less than 90°.

Referring to FIG. 5b, another multi-bit memory unit is disclosed as follows.

The multi-bit memory unit comprises a word line $WL^2$, a first bit line $BL^3$, a second bit line $BL^4$, a second connection point $C^2$, and a third connection point $C^3$, wherein the word line is the gate electrode, and the connection points are contact plugs.

The word line $WL^2$ is perpendicular to the first bit line $BL^3$ and the second bit line $BL^4$. The first bit line $BL^3$ is parallel to the second bit line $BL^4$, and the first bit line $BL^3$ and the second bit line $BL^4$ are segregated to two portions by the word line $WL^2$. The second connection point $C^2$ electrically connects to the first bit line $BL^3$, and the third connection point $C^3$ electrically connects to the second bit line $BL^4$, wherein the second connection point $C^2$ and the third connection point $C^3$ are located on the first and second source/drain regions separated by the word line $WL^2$. The active area 50 comprises the above elements. The active area 50 is rectangular, and the second connection point $C^2$ and the third connection point $C^3$ are respectively located on two ends of the active area 50. The included angle between the active area 50 and the word line $WL^2$ is less than 90°.

Referring to FIG. 5c, the memory array comprises word lines $WL^1$, $WL^2$, and $WL^3$, bit lines $BL^1$, $BL^2$, $BL^3$, $BL^4$, $BL^5$, and $BL^6$, connection points $C^1$, $C^2$, and $C^3$, memory unit 501, and active areas 50, wherein the memory unit 501 is the single multi-bit memory unit shown in FIG. 5a or 5b. Each connection point can be jointly used by four adjacent memory units, for example, the second connection point $C^2$ is jointly used by the memory unit 501 and its adjacent three memory units to form the electrical connection, as shown in FIG. 5d.

FIG. 5d shows a multi-bit memory array of FIG. 5c with peripheral circuits.

The memory array is driven by word line drivers, such as WL-1 Driver, and bit line drivers, such as BL-1 Driver. The word line driver is coupled to one word line and when the word line driver receive a control signal from the column decoder, the word line driver enables a selected column of memory units. The bit line driver is coupled to one bit line, wherein the bit line may be a first bit line or a second bit line. When data is written to or read from the memory array, an address is transmitted to the column decoder and the row decoder to enable the corresponding word line driver and bit line driver to activate the selected memory unit. The amplifier Amp further senses the output signal of the data in a memory unit to a predetermined electrical level and the data of the memory unit is temporarily stored in the output buffer.

FOURTH EMBODIMENT

Figure 6A:
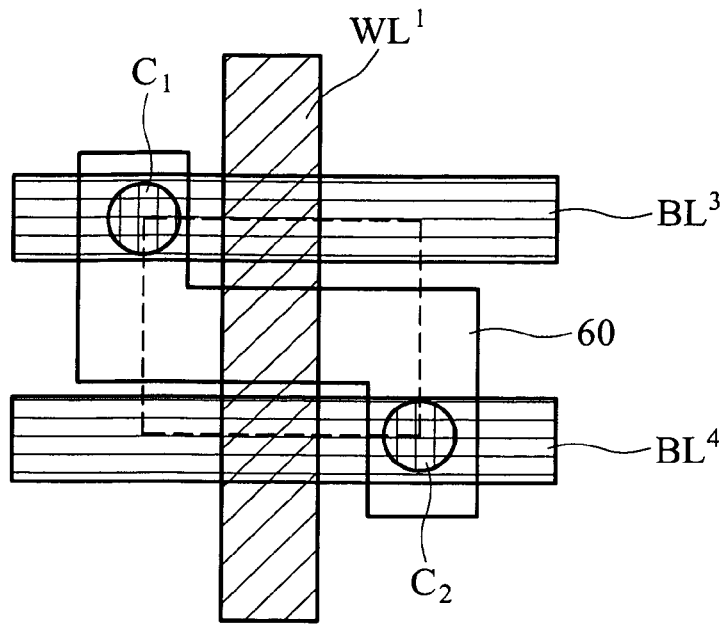
FIGS. 6a and 6b show two single multi-bit memory units of the fourth embodiment of the invention.
Figure 6B:
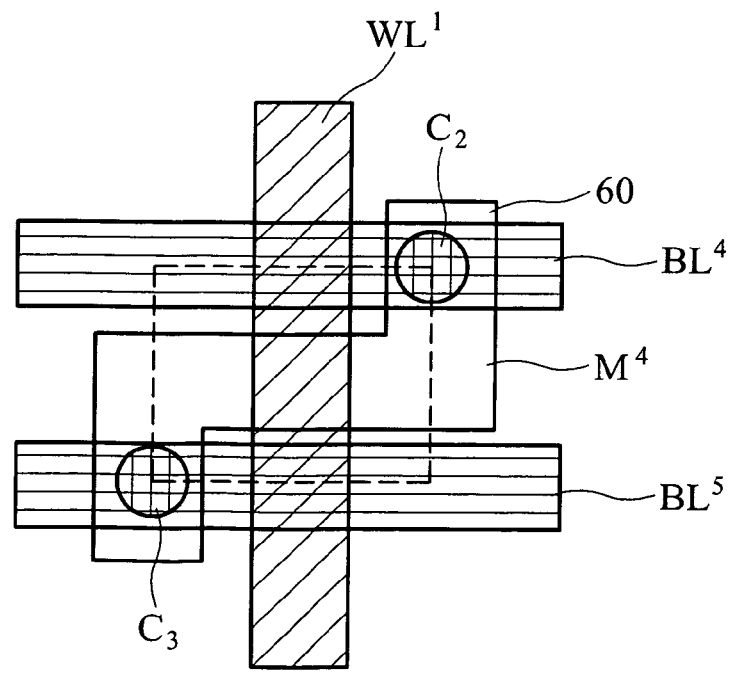
Figure 6C:
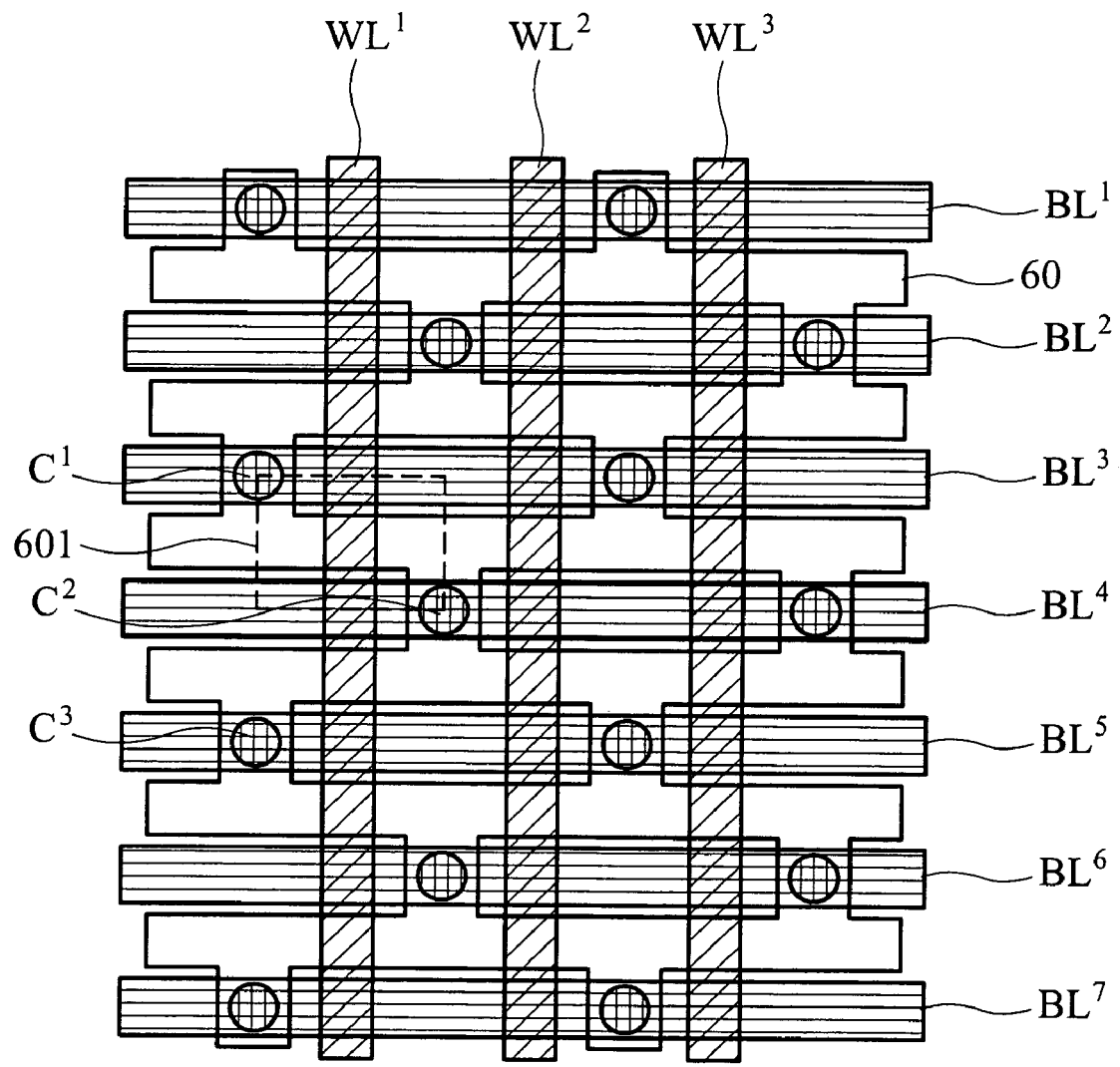
FIG. 6c shows a multi-bit memory array of the fourth embodiment of the invention.
Figure 6D:
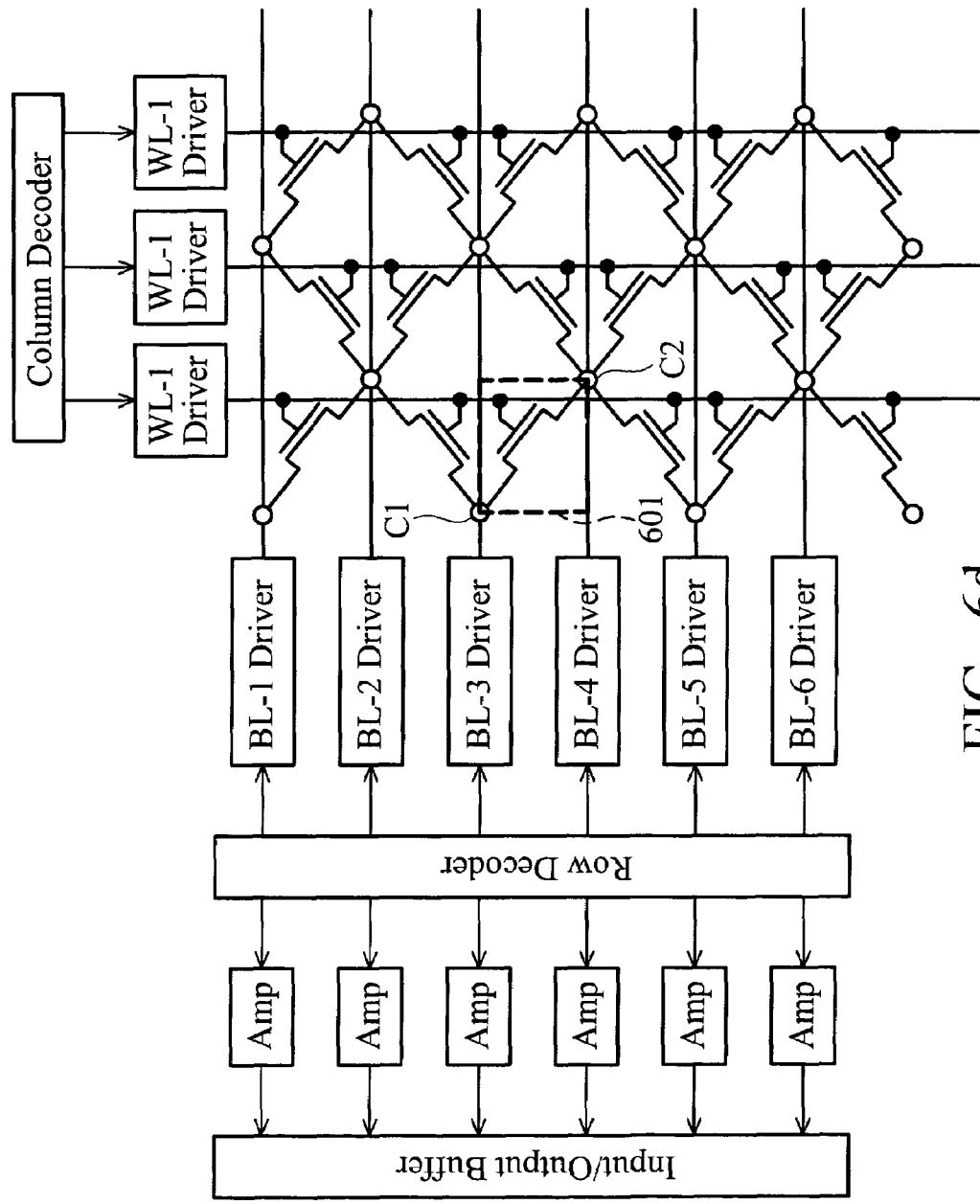
FIG. 6d shows a multi-bit memory array of FIG. 6c with peripheral circuits.

FIGS. 6a and 6b show two single multi-bit memory units of the fourth embodiment of the invention, FIG. 6c shows a memory array of the fourth embodiment of the invention, and FIG. 6d shows a multi-bit memory array of FIG. 6c with peripheral circuits.

Referring to FIGS. 6a and 6b, a semiconductor substrate (not shown) having a multi-bit memory unit shown in FIG. 2a or 2b is provided, with an active area 60 defined therein.

Referring to FIG. 6a, one of the two multi-bit memory units is disclosed in the following. The multi-bit memory unit comprises a word line $WL^1$, a first bit line $BL^3$, a second bit line $BL^4$, a first connection point $C^1$, and a second connection point $C^2$, wherein the word line is the gate electrode, and the connection points are contact plugs.

The word line $WL^1$ is perpendicular to the first bit line $BL^3$ and the second bit line $BL^4$. The first bit line $BL^3$ is parallel to the second bit line $BL^4$, and the first bit line $BL^3$ and the second bit line $BL^4$ are separated into two portions by the word line $WL^1$. The first connection point $C^1$ electrically connects to the first bit line $BL^3$, and the second connection point $C^2$ electrically connects to the second bit line $BL^4$, wherein the first connection point $C^1$ and the second connection point $C^2$ are located on the first and second source/drain regions separated by the word line $WL^1$. The active area 60 is under the above elements. The active area 60 is Z-shaped, comprising a main area and two extended areas, with the two extension areas perpendicularly connecting to two ends of the main area respectively. A first source/drain region is formed in one of the extended areas and a part of the main area, and a second source/drain region is formed in another extended area and a part of the main area. Therefore, the first connection point $C^1$ corresponding to the first source/drain region and the second connection point $C^2$ corresponding to the second source/drain region are respectively located on the terminal of the extension areas.

Referring to FIG. 6b, another multi-bit memory unit is disclosed as follows. The multi-bit memory unit comprises a word line $WL^2$, a second bit line $BL^4$, a third bit line $BL^5$, a second connection point $C^2$, and a third connection point $C^3$, wherein the word line is the gate electrode, and the connection points are contact plugs.

The word line $WL^2$ is perpendicular to the second bit line $BL^4$ and the third bit line $BL^5$. The second bit line $BL^4$ is parallel to the third bit line $BL^5$, and the second bit line $BL^4$ and the third bit line $BL^5$ are separated to two portions by the word line $WL^2$. The second connection point $C^2$ electrically connects to the second bit line $BL^4$, and the third connection point $C^3$ electrically connects to the third bit line $BL^5$, wherein the second connection point $C^2$ and the third connection point $C^3$ are located on different sides separated by the word line $WL^2$. The active area 60 comprises the above elements. The active area 60 is Z-shaped, comprising a main area and two extended areas, with the two extended areas perpendicularly connecting to two ends of the main area respectively. The second connection point $C^2$ and the third connection point $C^3$ are respectively located at the terminus of the extended areas.

Referring to FIG. 6c, the memory array comprises word lines $WL^1$, $WL^2$, and $WL^3$, bit lines $BL^1$, $BL^2$, $BL^3$, $BL^4$, $BL^5$, $BL^6$, and $BL^7$, connection points $C^1$, $C^2$, and $C^3$, memory unit 601, and active areas 60, wherein the memory unit 601 is the single multi-bit memory unit shown in FIG. 6a or 6b. Each connection point can be jointly used by four adjacent memory units, for example, the second connection point $C^2$ is jointly used by the memory unit 601 and its adjacent three memory units to form the electrical connection, as shown in FIG. 6c.

FIG. 6d shows a multi-bit memory array of FIG. 6c with peripheral circuits. The memory array is driven by word line drivers, such as WL-1 Driver, and bit line drivers, such as BL-1 Driver. The word line driver is coupled to one word line and when the word line driver receive a control signal from the column decoder, the word line driver enables a selected column of memory units. The bit line driver is coupled to one bit line, wherein the bit line may be a first bit line or a second bit line. When data is written to or read from the memory array, an address is transmitted to the column decoder and the row decoder to enable the corresponding word line driver and bit line driver to activate the selected memory unit. The amplifier Amp further senses the output signal of the data in a memory unit to a predetermined electrical level and the data of the memory unit is temporarily stored in the output buffer.

FIFTH EMBODIMENT

Figure 7A:
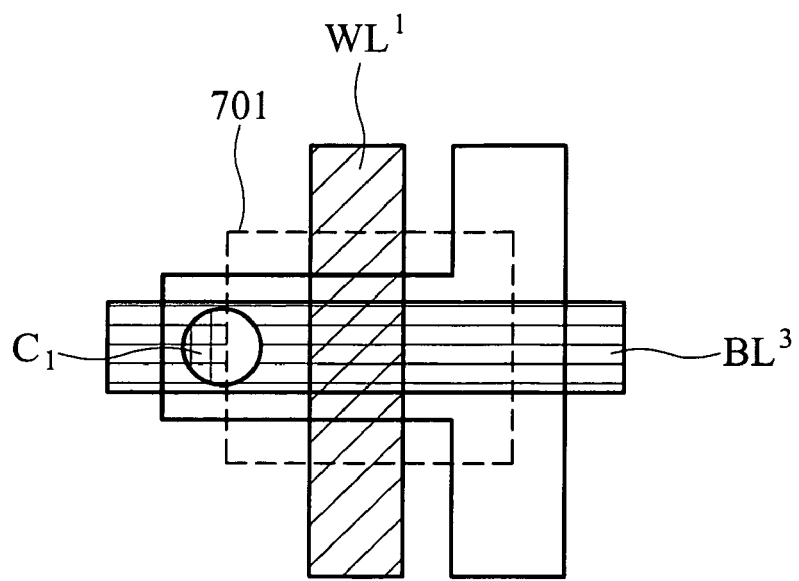
FIGS. 7a and 7b show two single multi-bit memory units of the fifth embodiment of the invention.
Figure 7B:
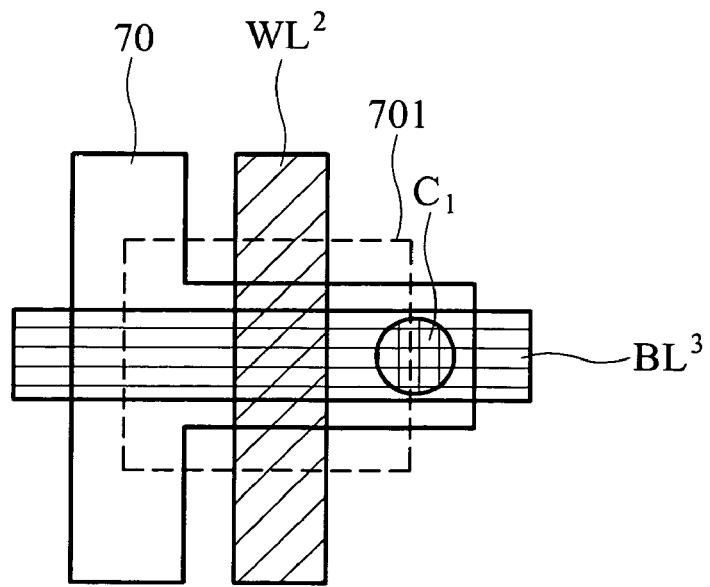
Figure 7C:
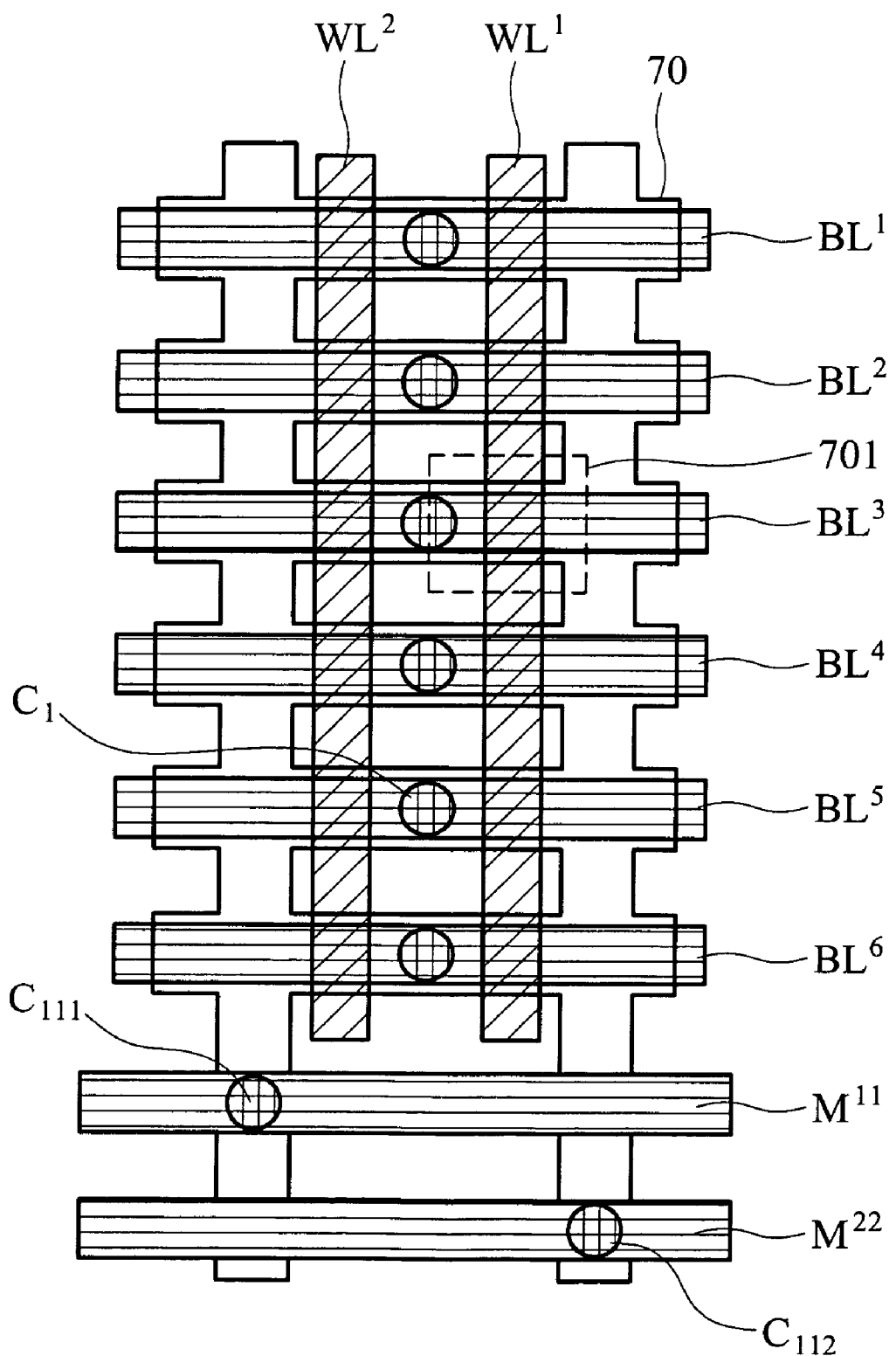
FIG. 7c shows a multi-bit memory array of the fifth embodiment of the invention.
Figure 7D:
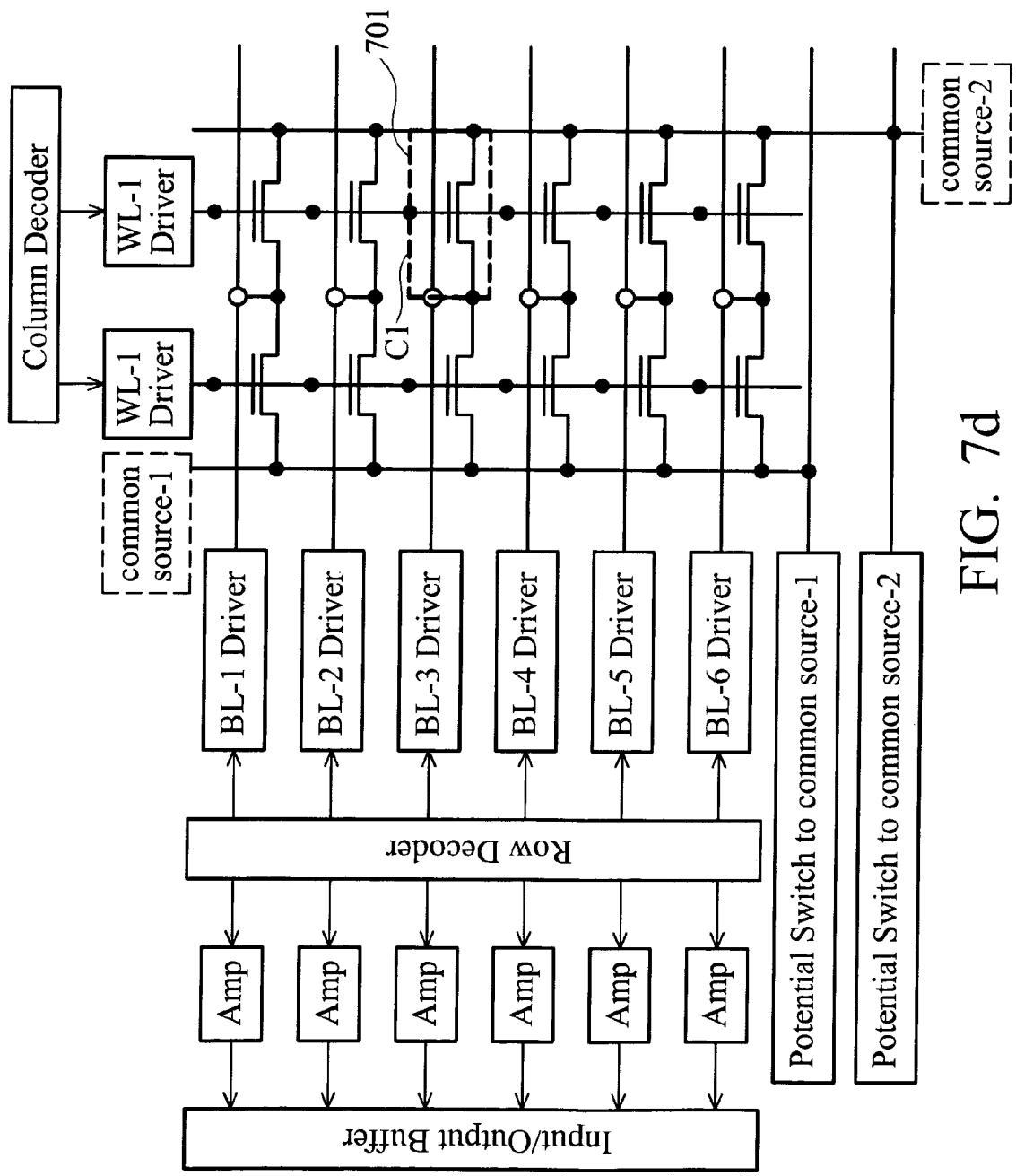
FIG. 7d shows a multi-bit memory array of FIG. 7c with peripheral circuits.

FIGS. 7a and 7b show two single multi-bit memory units of the fifth embodiment of the invention, FIG. 7c shows a memory array of the fifth embodiment of the invention, and FIG. 7d shows a multi-bit memory array of FIG. 7c with peripheral circuits.

Referring to FIGS. 7a and 7b, a semiconductor substrate (not shown) having a multi-bit memory unit shown in FIG. 2a or 2b is provided, with an active area 70 defined therein.

Referring to FIG. 7a, the two multi-bit memory units are disclosed as follows. The multi-bit memory unit comprises a word line $WL^1$ or $WL^2$, a first bit line $BL^3$, a first connection point $C^1$, wherein the word line is the gate electrode, and the connection point is a contact plug.

The word line $WL^1$ or $WL^2$ is perpendicular to the first bit line $BL^3$, thus the first bit line $BL^3$ is separated to two portions thereby. The first connection point $C^1$ is located on one of the first and second source/drain regions separated sides by the word line $WL^1$ or $WL^2$, and electrically connects to the first bit line $BL^3$. The active area 70 is under the above elements. The active area 70 is T-shaped, comprising a main area and an extended area, with one end of the main area connecting to the middle of the extended area. The main area is parallel to the first bit line $BL^3$ (the first source line) corresponding thereto. The extended area is parallel to the word line corresponding thereto.

Referring to FIG. 7c, the memory array comprises word lines $WL^1$ and $WL^2$, bit lines $BL^1$, $BL^2$, $BL^3$, $BL^4$, $BL^5$, and $BL^6$, connection points $C^1$, $C^{111}$, and $C^{112}$, memory unit 701, and active areas 70, wherein the memory unit 701 is the single multi-bit memory unit shown in FIG. 7a or 7b. Each connection point corresponding to the drain area can be jointly used by two adjacent memory units in the same row, and the source area installed on the same column can be jointly used by each memory unit in the same column. Additionally, memory units connect to the additional metal line $M^{11}$ or $M^{12}$ by the connection point $C^{111}$ or $C^{112}$. Referring to FIG. 7d, the first connection point $C^1$ is jointly used by the memory unit 701 and its adjacent memory unit in the same row to form the electrical connection, and the source area, such as source-1, installed on the same column can be jointly used by each memory unit in the same column. Additionally, memory units connect to potential switch through the additional metal line $M^{11}$ or $M^{12}$ by the connection point $C^{111}$ or $C^{112}$ as common sources. Furthermore, the operation of the circuit of FIG. 7d is similar to the operation of FIG. 3c, FIG. 4c, FIG. 5d and FIG. 6d.

SIXTH EMBODIMENT

Figure 8:
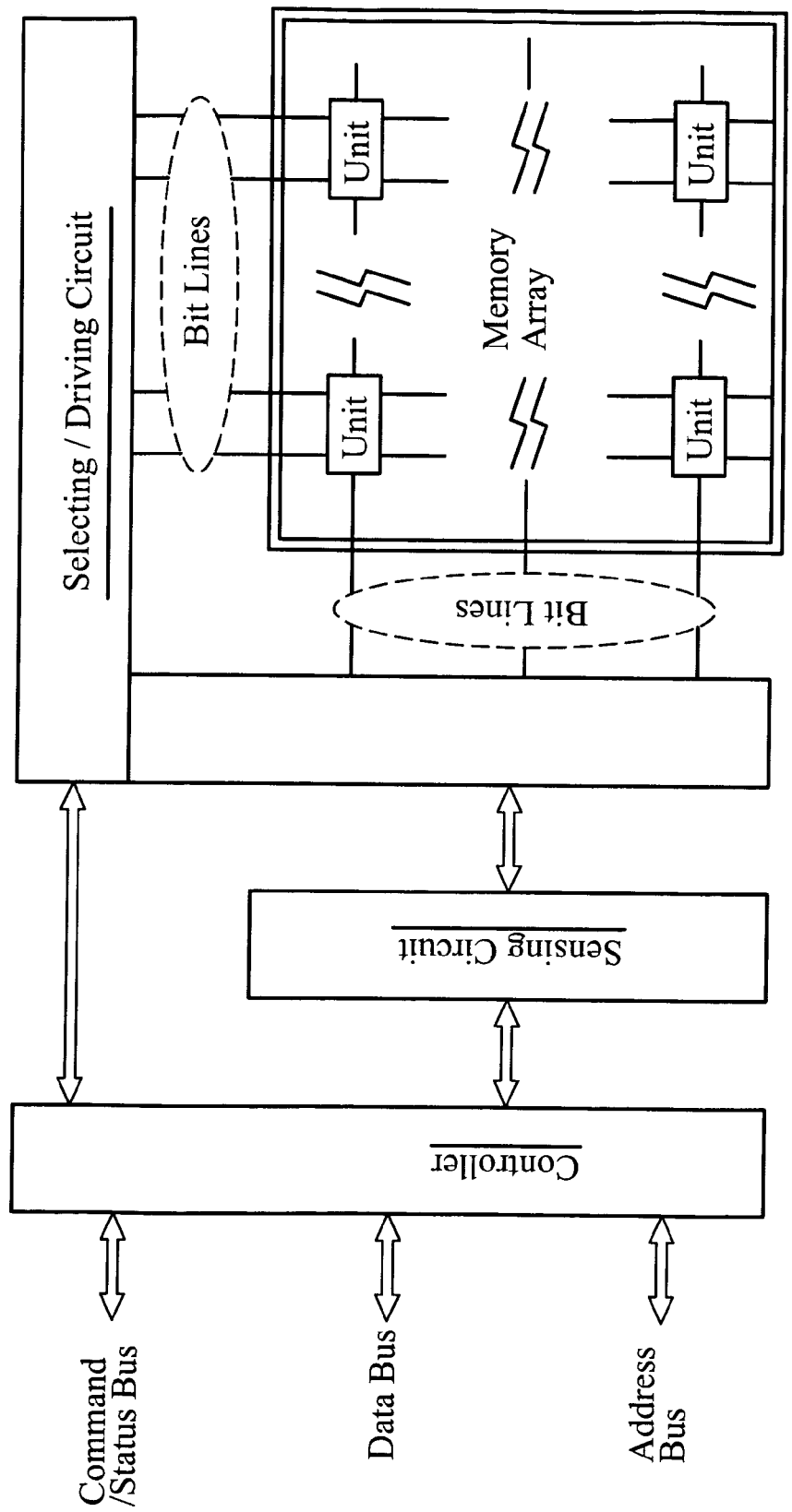
FIG. 8 shows a memory system diagram of one embodiment the invention.

FIG. 8 shows a memory circuit diagram of a six embodiment of the invention. Referring FIG. 8, the memory array may be the memory array of the first, the second, the third, the fourth and the fifth embodiments, and peripheral circuits including a selecting/driving circuit, a plurality of first and second bit lines, a sensing circuit and a controller are disclosed. The selecting/driving circuit is coupled to a plurality of word lines and a plurality of first and second bit lines of memory units. The sensing circuit is coupled to the first and the second bit lines through the selecting/driving circuit to amplify the signals of the data in the memory units. The controller performs a memory operation, such as reading, writing, on the memory units. The controller coupled to the selecting/driving and sensing circuits receive a command from an external data bus or command bus and an address from the external address bus. The controller generates a plurality of control signals to the selecting/driving and sensing circuits based on the received command, thus, the selecting/driving circuit selects memory units based on the address. When the controller receives a write command, the controller writes the data to the corresponding memory units selected by the selecting/driving circuit. When the controller receives a read command, the sensing circuit reads the data of the corresponding memory units via the bit lines. The controller is further capable of performing at least one of various operating functions including an initializing operation, a reading operation, a programming operation, a program-verifying operation, an erasing operation, an erase-verifying operation, a self-testing operation and a repairing operation.

The operations described in this disclosure, such as reading operation, programming operation and others, can be applied to the memory unit of the six embodiments, and the detailed operations are described as following. The initializing operation comprises selecting at least one memory unit, applying a first initializing signal to a word line of the memory unit, applying a second initializing signal to a first bit line of the memory unit, and applying a third initializing signal to a second bit line of the memory unit when the output current of the memory unit is lower than a predetermined current level. The reading operation comprises selecting one memory unit, applying a first reading signal to the word line of the memory unit, applying a second reading signal to one of the first and the second bit lines of the memory unit, and coupling another one of the first and the second bit lines of the memory unit to the ground or the same potential as the semiconductor substrate. The programming operation comprises selecting at least one memory unit, applying a first programming signal to the word line of the memory unit, applying a second programming signal to one of the first and the second bit lines of the memory unit, and coupling another one of the first and the second bit lines of the memory unit to the ground or the same potential as the semiconductor substrate. The program-verifying operation comprises selecting at least one memory unit, sensing the output current of the memory unit, and applying a programming operation to the memory unit if the output current is higher than a predetermined current level. The erasing operation comprises selecting at least one memory unit, applying a first erasing signal to the word line of the memory unit, and applying a second erasing signal to at least one of the first and the second bit lines of the memory unit. The erase-verifying operation comprises selecting at least one memory unit, sensing the output current of the memory unit, and applying a erasing operation to the memory unit if the output current is lower than a predetermined current level. The self-testing operation comprises selecting at least one memory unit, applying a first self-testing signal to a word line of the memory unit, applying a second self-testing signal to the first bit line of the memory unit, applying a third self-testing signal to the second bit line of the memory unit, and when the output current of the memory unit is out of a predetermined current range, the controller outputs an error signal. The repairing operation comprises switching off a damaged word line or a damaged bit line, and selecting and switching on a redundant word line or a redundant bit line for replacing the damaged word line or the damaged bit line.

The invention provides two blocks in a memory unit to store data, that is, two sets of data can be programmed or erased in a single transistor. The maximum set count of data programmed or erased each time is twice the number of memory units.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory array system, comprising:
   a plurality of word lines;
   a plurality of first bit lines or first source/drain lines;
   a plurality of second bit lines or second source/drain lines; and
   a plurality of memory units, each memory unit comprising:
      a gate electrode, coupled to one of the word lines;
      a gate dielectric layer laid below the gate electrode;
      an active area, comprising:
         a first source/drain region, coupled to one of the first source/drain lines or the first bit lines, further comprising a first multi-layer dielectric spacer formed between the first source/drain region and the gate electrode to store electrons or electric charge;
         a second source/drain region, coupled to one of the second source/drain lines or the second bit lines, further comprising a second multi-layer dielectric spacer formed between the second source/drain region and the gate electrode to store electrons or electric charge; and
         a semiconductor channel formed between said first source/drain region and second source/drain region;
      a metal-semiconductor compound layer formed over the gate electrode, first source/drain region and second source/drain region;
   a selecting/driving circuit coupled to the word lines, the first bit lines and the second bit lines to select corresponding memory units based on predetermined address,
   a sensing circuit coupled to the selecting/driving circuit to amplify output signals of data stored in the corresponding memory units; and
   a controller coupled to the selecting/driving circuit and the sensing circuit to perform memory operations on the memory units.

2. The system as claimed in claim 1, wherein the controller further receives a command from an external data bus or command bus, and generates or transmits a plurality of control signals to the selecting/driving and sensing circuits based on the received command.

3. The system as claimed in claim 1, wherein the controller further receives the address from the external address bus, and outputs the status and data stored in the memory array.

4. The system as claimed in claim 1, further comprises extra memory units arranged in column, row or matrix form as redundancy memory units for memory repairing, replacement or reading reference.

5. The system according to claim 1, wherein the controller performs at least one of a plurality of operating functions including an initializing operation, a reading operation, a programming operation, a program-verifying operation, a disturbing prevention operation, an erasing operation, an erase-verifying operation, a self-testing operation and a repairing operation on a single memory unit or a plurality of memory units.

6. The system according to claim 5, wherein the reading operation comprises:
   selecting at least one memory unit;
   applying a first reading signal to the word line of the memory unit;
   applying a second reading signal to one of the first and the second bit lines of the memory unit;
   applying a third reading signal or ground potential to another one of the first and the second bit lines of the memory unit; and
   sensing the signals from the first and second bit lines of the memory unit.

7. The system according to claim 5, wherein the programming operation comprises:
   selecting at least one memory unit;
   applying a first programming signal to the word line of the memory unit;
   applying a second programming signal to one of the first and the second bit lines of the memory unit; and
   applying a third programming signal or ground potential to another one of the first and the second bit lines of the memory unit.

8. The system according to claim 5, wherein the erasing operation comprises:
   selecting at least one memory unit;
   applying a first erasing signal to the word line of the memory unit; and
   applying a second erasing signal to one or both of the first and the second bit lines of the memory unit.

9. The system according to claim 5, wherein the program-verifying operation comprises:
   selecting at least one memory unit;
   applying a reading operation to the memory unit; and
   applying a programming operation to the memory unit if the output signal is higher than a predetermined electrical level.

10. The system according to claim 5, wherein the erase-verifying operation comprises:
    selecting at least one memory unit;
    applying a reading operation to the memory unit; and
    applying a erasing operation to the memory unit if the output signal is higher than a predetermined signal level.

11. The system according to claim 5, wherein the initializing operation comprises:
    selecting at least one memory unit;
    applying a first initializing signal to a word line of the memory unit;
    applying a second initializing signal to a first bit line of the memory unit; and
    applying a third initializing signal to a second bit line of the memory unit until the output signal of the memory unit is lower than a predetermined signal level.

12. The system according to claim 5, wherein the disturbing prevention operation comprises:
    selecting at least one memory unit;

applying a first disturbing prevention signal to the word line of the memory unit;
applying a second disturbing prevention signal to one of the first and the second bit lines of the memory unit; and
applying a third disturbing prevention signal to another one of the first or the second bit lines of the memory unit.

13. The system according to claim 5, wherein the self-testing operation comprises:
selecting at least one memory unit;
applying a first self-testing signal to a word line of the memory unit;
applying a second self-testing signal to the first bit line of the memory unit;
applying a third self-testing signal to the second bit line of the memory unit;
applying a reading operation to the memory unit; and
when the output signal of the memory unit is out of a predetermined signal range, the controller outputs an error or damage signal.

14. The system according to claim 5, wherein the repairing operation comprises:
switching off a word line or a bit line with damaged memory units; and
selecting and switching on a redundant word line or a redundant bit line with memory redundancy for replacing the word line or the bit line with damaged memory units.

15. The system as claimed in claim 1, wherein the selecting/driving circuit further comprises:
a plurality of word line drivers coupled to the word lines wherein for providing electrical signals to corresponding word lines based on addresses or commands from the controller,
a row decoder coupled to the word line drivers to receives the addresses from the controller or external address bus,
a plurality of bit line drivers coupled to the first and the second bit lines, wherein the bit line drivers provide electrical signals to the corresponding first and second bit lines based on the address or the commands from the controller, and
a column decoder coupled to the bit line drivers to receive the addresses from the controller or external address bus.

16. The system as claimed in claim 1, wherein the selecting/driving circuit comprises at least one charge pump to supply high voltage power or negative voltage power to the word line drivers or the bit line drivers.

17. The system as claimed in claim 1, wherein the sensing circuit further comprises
a plurality of differential amplifiers or sense amplifiers to detect and amplify signals from the corresponding memory units and selecting/driving circuit;
a plurality of reference memory units wherein each reference memory unit comprising a predetermined gate length and width is coupled to a corresponding differential amplifier for comparing output signals from a selected memory unit in the memory array, and
an output buffer coupled to a plurality of differential amplifiers to receive and output the amplified signals to the controller or external data bus.

18. The memory array system as claimed in claim 1, wherein the active area is perpendicular to the word line.

19. The memory array system as claimed in claim 1, wherein an included angle between the active area and the word line is less than 90°.

20. The memory array system as claimed in claim 1, wherein the active area is Z-shaped and comprises a main area and two extended areas, with the two extended areas perpendicularly connecting to two ends of the main area respectively, and the first source/drain region is in one of the extended areas and a part of the main area, and the second source/drain region is in another extended area and a part of the main area.

21. The memory array system as claimed in claim 1, wherein the active area is T-shaped and comprises a main area and an extended area, wherein the end of the main area connects to the middle of the extended area, and the active area is parallel to the first source/drain line or the first bit line corresponding thereto, and the extended area is parallel to the word line corresponding thereto, and the first source/drain region is in a part of the main area, and the second source/drain region is in the extended area and a part of the main area.

22. A memory array system, comprising:
a plurality of word lines;
a plurality of first bit lines or first source/drain lines;
a plurality of second bit lines or second source/drain lines; and
a plurality of memory units, each memory unit comprising:
a gate electrode, coupled to one of the word lines;
a gate dielectric layer laid below the gate electrode;
an active area, comprising:
a first source/drain region coupled to one of the first source/drain lines or the first bit lines;
a second source/drain region coupled to one of the second source/drain lines or the second bit lines;
a programmable source/drain extended doped region formed between the gate electrode and the first or second source/drain region for storing or keeping electric information; and
a semiconductor channel formed between said first source/drain region and second source/drain region;
a metal-semiconductor compound layer formed over the gate electrode, first source/drain region and second source/drain region;
a selecting/driving circuit coupled to the word lines, the first bit lines and the second bit lines to select a corresponding memory unit based on predetermined address,
a sensing circuit coupled to the first bit lines and the second bit lines to amplify a voltage of data stored in the corresponding memory unit; and
a controller coupled to the selecting/driving circuit and the sensing circuit to perform memory operations on the memory units.

23. The memory array as claimed in claim 22, further comprises extra memory units arranged in column, row or matrix form as redundancy for memory repair, replacement or reading reference.

24. The memory array system as claimed in claim 22, wherein the controller performs at least one of a plurality of operating functions including an initializing operation, a reading operation, self-testing operation and a repairing operation.

25. The memory array system as claimed in claim 22, wherein the selecting/driving circuit comprises:
a plurality of word line drivers coupled to the word lines for providing electrical signals to corresponding word lines based on addresses or commands from the controller,
a row decoder coupled to the word line drivers for receiving the addresses from the controller or an external address bus,
a plurality of bit line drivers coupled to a plurality of first and second bit lines to provide electrical signals to the corresponding first and second bit lines based on the addresses or the commands from the controller, and a column decoder coupled to the bit line drivers to receive the addresses from the controller or external address bus.

26. The memory array system as claimed in claim 22, wherein the sensing circuit comprises
   a plurality of differential amplifiers or sense amplifiers to detect and amplify signals from the corresponding memory units and selecting/driving circuit;
   a plurality of reference memory units wherein each reference memory unit comprises a predetermined gate length and width is coupled to a corresponding differential amplifier for comparing output signals from a selected memory unit in the memory array, and
   an output buffer coupled to a plurality of differential amplifiers to receive and output the amplified signals to the controller or external data bus.

27. The memory array system as claimed in claim 22, wherein the active area is perpendicular to the word line.

28. The memory array system as claimed in claim 22, wherein an included angle between the active area and the word line is less than 90°.

29. The memory array system as claimed in claim 22, wherein the active area is Z-shaped and comprises a main area and two extended areas, with the two extended areas perpendicularly coupled to two ends of the main area respectively, with the first source/drain region in one of the extended areas and a part of the main area, and the second source/drain region in another extended area and a part of the main area.

30. The memory array system as claimed in claim 22, wherein the active area is T-shaped and comprises a main area and an extended area, wherein the end of the main area is coupled to the middle of the extended area, and the active area is parallel to the first source/drain line or the first bit line corresponding thereto, and the extended area is parallel to the word line corresponding thereto, with the first source/drain region in a part of the main area, and the second source/drain region in the extended area and a part of the main area.

31. The array system as claimed in claim 24, wherein the reading operation comprises:
   selecting at least one memory unit;
   applying a first reading signal to the word line of the memory unit;
   applying a second reading signal to one of the first and the second bit lines of the memory unit; applying a third reading signal or ground potential to another one of the first and the second bit lines of the memory unit; and
   sensing the signals from the first and second bit lines of the memory unit.

32. The array system as claimed in claim 24, wherein the self-testing operation comprises:
   selecting at least one memory unit;
   applying a first self-testing signal to a word line of the memory unit;
   applying a second self-testing signal to the first bit line of the memory unit;
   applying a third self-testing signal to the second bit line of the memory unit;
   applying a reading operation to the memory unit; and
   when the output current of the memory unit is out of a predetermined signal range, the controller outputs an error or damage signal.

33. The array system as claimed in claim 24, wherein the repairing operation comprises:
   switching off a word line or a bit line with damaged memory units; and
   selecting and switching on a redundant word line or a redundant bit line with memory redundancy for replacing the word line or the bit line with damaged memory units.

* * * * *